(12) United States Patent
Wang

(10) Patent No.: US 12,422,487 B2
(45) Date of Patent: Sep. 23, 2025

(54) DETECTION METHOD AND APPARATUS FOR BATTERY SYSTEM

(71) Applicant: Huawei Digital Power Technologies Co., Ltd., Shenzhen (CN)

(72) Inventor: Wencheng Wang, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 150 days.

(21) Appl. No.: 18/456,331

(22) Filed: Aug. 25, 2023

(65) Prior Publication Data

US 2023/0400516 A1    Dec. 14, 2023

Related U.S. Application Data

(63) Continuation of application No. PCT/CN2021/078257, filed on Feb. 26, 2021.

(51) Int. Cl.
| | | |
|---|---|---|
| G01R 31/36 | (2020.01) |
| G01R 27/02 | (2006.01) |
| G01R 31/378 | (2019.01) |
| G01R 31/389 | (2019.01) |
| G01R 31/396 | (2019.01) |

(52) U.S. Cl.
CPC ....... G01R 31/3648 (2013.01); G01R 27/025 (2013.01); G01R 31/378 (2019.01); G01R 31/389 (2019.01); G01R 31/396 (2019.01)

(58) Field of Classification Search
CPC .......... G01R 31/3648; G01R 31/389; G01R 31/396; G01R 31/378; G01R 27/025

USPC ............. 324/500, 600, 76.11, 434, 426
See application file for complete search history.

(56) References Cited

U.S. PATENT DOCUMENTS

| | | | | |
|---|---|---|---|---|
| 9,921,252 | B2 * | 3/2018 | Paris | G01R 27/025 |
| 2015/0058654 | A1 * | 2/2015 | Ukai | G06F 1/26 |
| | | | | 713/340 |
| 2019/0064280 | A1 | 2/2019 | Sun et al. | |
| 2020/0116791 | A1 | 4/2020 | Song | |
| 2020/0217893 | A1 | 7/2020 | Song | |
| 2020/0225275 | A1 * | 7/2020 | Du | G01R 31/52 |
| 2021/0231726 | A1 | 7/2021 | Du et al. | |

FOREIGN PATENT DOCUMENTS

| | | |
|---|---|---|
| CN | 109765495 A | 5/2019 |
| CN | 110967606 A | 4/2020 |

* cited by examiner

*Primary Examiner* — Giovanni Astacio-Oquendo
*Assistant Examiner* — Trung Q Nguyen
(74) *Attorney, Agent, or Firm* — Conley Rose, P.C.

(57) ABSTRACT

An apparatus for a battery system includes a switching unit and a processing unit. The switching unit includes a plurality of switching branches and a plurality of switching switches, where each of the plurality of switching branches includes a switching resistor, and the plurality of switching switches are configured to control the plurality of switching branches to be switched in or out between the following plurality of terminals and a reference ground: a positive electrode of a battery pack, a second terminal of a first contactor, a negative electrode of the battery pack, and a second terminal of a second contactor. The processing unit is configured to detect sampling point voltage information of the plurality of switching branches.

20 Claims, 10 Drawing Sheets

```
┌─────────────────────────────────────────────────────────────────┐
│ A processing unit controls a plurality of switching switches to be in a first │
│ working state, where the first working state is that a first switching switch S1 │ ～ S401
│ and a second switching switch S2 are turned on, and a third switching switch │
│         S3 and a fourth switching switch S4 are turned off       │
└─────────────────────────────────────────────────────────────────┘
                                  │
┌─────────────────────────────────────────────────────────────────┐
│ When the plurality of switching switches are in the first working state, the │
│ processing unit detects a first sampling point voltage U1 of a first switching │ ～ S402
│ branch and a second sampling point voltage U2 of a second switching branch │
└─────────────────────────────────────────────────────────────────┘
                                  │
┌─────────────────────────────────────────────────────────────────┐
│ The processing unit determines a battery pack voltage $U_{bat}$ based on the first │ ～ S403
│      sampling point voltage U1 and the second sampling point voltage U2 │
└─────────────────────────────────────────────────────────────────┘
```

FIG. 4

```
┌─────────────────────────────────────────────────────────────────┐
│  A processing unit controls a plurality of switching switches, a first contactor, │
│     and a second contactor to be in a second working state, where the second │
│  working state is that a first switching switch S1 and a second switching switch │ ～ S501
│  S2 are turned off, a third switching switch S3 and a fourth switching switch S4 │
│   are turned on, and the first contactor and the second contactor are turned off │
└─────────────────────────────────────────────────────────────────┘
                                  │
┌─────────────────────────────────────────────────────────────────┐
│  When the plurality of switching switches are in the second working state, the │
│  processing unit detects a third sampling point voltage U3 of a third switching │ ～ S502
│    branch and a fourth sampling point voltage U4 of a fourth switching branch │
└─────────────────────────────────────────────────────────────────┘
                                  │
┌─────────────────────────────────────────────────────────────────┐
│ The processing unit determines a load voltage $U_{load}$ based on the third sampling │ ～ S503
│          point voltage U3 and the fourth sampling point voltage U4 │
└─────────────────────────────────────────────────────────────────┘
```

FIG. 5

```
┌─────────────────────────────────────────────────────────────┐
│ A processing unit controls a plurality of switching switches│
│ to be in a first working state, where the first working     │
│ state is that a first switching switch S1 and a second      │──── S601
│ switching switch S2 are turned on, and a third switching    │
│ switch S3 and a fourth switching switch S4 are turned off   │
└─────────────────────────────────────────────────────────────┘
                              │
┌─────────────────────────────────────────────────────────────┐
│ When the plurality of switching switches are in the first   │
│ working state, the processing unit detects a first sampling │──── S602
│ point voltage U1 of a first switching branch and a second   │
│ sampling point voltage U2 of a second switching branch      │
└─────────────────────────────────────────────────────────────┘
                              │
┌─────────────────────────────────────────────────────────────┐
│ The processing unit controls the plurality of switching     │
│ switches to be in a third working state, where the third    │
│ working state is that the first switching switch S1 is      │──── S603
│ turned on, and the second switching switch S2 to the fourth │
│ switching switch S4 are turned off                          │
└─────────────────────────────────────────────────────────────┘
                              │
┌─────────────────────────────────────────────────────────────┐
│ When the plurality of switching switches are in the third   │
│ working state, the processing unit detects a fifth sampling │──── S604
│ point voltage U5 of the first switching branch              │
└─────────────────────────────────────────────────────────────┘
                              │
┌─────────────────────────────────────────────────────────────┐
│ The processing unit determines an insulation resistance     │
│ value $R_p$ to ground of a positive electrode of a battery  │
│ pack and an insulation resistance value $R_n$ to ground of  │──── S605
│ a negative electrode of the battery pack based on the first │
│ sampling point voltage U1, the second sampling point        │
│ voltage U2, and the fifth sampling point voltage U5         │
└─────────────────────────────────────────────────────────────┘
```

FIG. 6

DETECTION METHOD AND APPARATUS FOR BATTERY SYSTEM

CROSS-REFERENCE TO RELATED APPLICATIONS

This is a continuation of Int'l Patent App. No. PCT/CN2021/078257, filed on Feb. 26, 2021, which is incorporated by reference.

FIELD

This disclosure relates to the battery field, and in particular, to a detection method and apparatus for a battery system.

BACKGROUND

Currently, a direct current voltage of a high-voltage battery system used in an electric vehicle or a hybrid electric vehicle is far greater than a human safety voltage. For example, a direct current voltage range of the high-voltage battery system is usually 200 volts (V) to 800 V, but the human safety voltage is 60 V. Therefore, for safety reasons, high-voltage detection and insulation detection need to be performed on the battery system. High-voltage detection refers to detecting a battery pack voltage and a load voltage in the high-voltage battery system, and insulation detection refers to detecting insulation resistance to ground of two poles of a battery pack in the high-voltage battery system.

However, in a conventional solution for detecting a high-voltage battery system, high-voltage detection and insulation detection need to be electrically isolated. Therefore, high-voltage detection and insulation detection are usually designed as two sets of circuits with independent functions, and the circuits are complex and occupy a large circuit area.

SUMMARY

This disclosure provides a detection method and apparatus for a battery system, to optimize a circuit design.

According to a first aspect, a detection apparatus for a battery system is provided. The battery system includes a battery pack, a first contactor, and a second contactor. A first terminal of the first contactor is connected to a positive electrode of the battery pack, a first terminal of the second contactor is connected to a negative electrode of the battery pack, a second terminal of the first contactor is configured to connect to a first terminal of a load, and a second terminal of the second contactor is configured to connect to a second terminal of the load. The detection apparatus includes: a switching unit, including a plurality of switching branches and a plurality of switching switches, where each of the plurality of switching branches includes a switching resistor, and the plurality of switching switches are configured to control the plurality of switching branches to be switched in or out between the following plurality of terminals and a reference ground: the positive electrode of the battery pack, the second terminal of the first contactor, the negative electrode of the battery pack, and the second terminal of the second contactor, where the reference ground is configured to connect to a vehicle body ground; and a processing unit configured to: detect sampling point voltage information of the plurality of switching branches, where the sampling point voltage information is used to indicate sampling point voltages of the plurality of switching branches; and determine high-voltage detection information and insulation detection information based on the sampling point voltage information, where the high-voltage detection information includes at least one of the following: a battery pack voltage $U_{bat}$ and a load voltage $U_{load}$, and the insulation detection information includes at least one of the following: an insulation resistance value $R_p$ to ground of the positive electrode of the battery pack and an insulation resistance value $R_n$ to ground of the negative electrode of the battery pack.

The switching unit is disposed in the detection apparatus for the battery system, and the plurality of switching branches in the switching unit may be flexibly switched in or out between a plurality of terminals in the battery system and the reference ground. By using the plurality of switching branches, the detection apparatus 200 may detect sampling point voltages of the plurality of switching branches in different statuses, to implement high-voltage detection and insulation detection of the battery system. Because the reference ground of the plurality of switching branches in the switching unit is configured to connect to the vehicle body ground, electric isolation may not need to be performed for high-voltage detection and insulation detection inside the detection apparatus, and high-voltage detection and insulation detection of the battery system are implemented by using one set of circuits, so that a circuit design can be optimized, and detection efficiency of the battery system can be improved.

With reference to the first aspect, in a possible implementation, the processing unit is further configured to determine at least one of the following information based on the sampling point voltage information: contact status information of the first contactor and contact status information of the second contactor, where the contact status information is used to indicate whether a contact of the contactor is adhered to.

In addition to high-voltage detection and insulation detection, the detection apparatus may further implement contact adhesion detection of the contactor of the battery system by using the same set of circuits, thereby further optimizing the circuit design.

With reference to the first aspect, in a possible implementation, the switching unit further includes a plurality of sampling branches, a first terminal of each of the plurality of sampling branches is connected to a second terminal of at least one of the plurality of switching branches, and a second terminal of each of the plurality of sampling branches is connected to the reference ground.

The plurality of sampling branches may be used to collect the sampling point voltages of the plurality of switching branches, and the plurality of sampling branches may be reused in high-voltage detection, insulation detection, and contact adhesion detection, thereby optimizing the circuit design.

With reference to the first aspect, in a possible implementation, each of the plurality of sampling branches includes an upsampling resistor and a downsampling resistor, a first terminal of the upsampling resistor is connected to the first terminal of each sampling branch, a second terminal of the upsampling resistor is connected to a first terminal of the downsampling resistor, and a second terminal of the downsampling resistor is connected to the reference ground, where a sampling point voltage of the switching branch is a voltage at the second terminal of the upsampling resistor.

With reference to the first aspect, in a possible implementation, the plurality of switching branches include a first switching branch to a fourth switching branch, and the plurality of switching switches include a first switching switch to a fourth switching switch. The first switching branch includes a first switching resistor, and the first switching switch is configured to control the first switching branch to be switched in or out between the positive electrode of the battery pack and the reference ground. The second switching branch includes a second switching resistor, and the second switching switch is configured to control the second switching branch to be switched in or out between the negative electrode of the battery pack and the reference ground. The third switching branch includes a third switching resistor, and the third switching switch is configured to control the third switching branch to be switched in or out between the second terminal of the first contactor and the reference ground. The fourth switching branch includes a fourth switching resistor, and the fourth switching switch is configured to control the fourth switching branch to be switched in or out between the second terminal of the second contactor and the reference ground.

For different detection scenarios such as high-voltage detection, insulation detection, or contact adhesion detection, the plurality of switching switches and the plurality of switching branches can be used to flexibly control the plurality of switching branches to be switched in or out between the terminals in the battery system and the reference ground. The plurality of switching switches and the plurality of switching branches can be reused in different detection scenarios, thereby achieving an objective of simplifying and optimizing the circuit design.

With reference to the first aspect, in a possible implementation, the plurality of sampling branches include a first sampling branch and a second sampling branch. A first terminal of the first sampling branch is connected to a second terminal of the first switching branch and a second terminal of the third switching branch. A second terminal of the second sampling branch is connected to a second terminal of the second switching branch and a second terminal of the fourth switching branch.

Through control by using the switching switches, two sampling branches may be used to collect sampling point voltages of four switching branches, thereby improving utilization of the sampling branches, and simplifying the circuit design.

With reference to the first aspect, in a possible implementation, the processing unit is further configured to: control the plurality of switching switches to be in a first working state, where the first working state is that the first switching switch and the second switching switch are turned on, and the third switching switch and the fourth switching switch are turned off; when the plurality of switching switches are in the first working state, detect a first sampling point voltage U1 of the first switching branch and a second sampling point voltage U2 of the second switching branch; and determine the battery pack voltage $U_{bat}$ based on the first sampling point voltage U1 and the second sampling point voltage U2.

The processing unit controls turn-on and turn-off of the switching switches, and collects a corresponding sampling point voltage for calculation, so that the detection apparatus may be used to detect the battery pack voltage $U_{bat}$ of the battery system.

With reference to the first aspect, in a possible implementation, the processing unit is further configured to determine the battery pack voltage $U_{bat}$ based on the following formulas:

$$U_{bat}=U_p-U_n$$

$$U_p=U1\times(R1+R_{11}+R_{12})/R_{12}$$

$$U_n=U2\times(R2+R_{21}+R_{22})R_{22}.$$

$U_p$ represents a positive electrode voltage of the battery pack, $U_n$ represents a negative electrode voltage of the battery pack, R1 represents a resistance value of the first switching resistor, R2 represents a resistance value of the second switching resistor, $R_{11}$ represents a resistance value of an upsampling resistor of the first sampling branch, $R_{12}$ represents a resistance value of a downsampling resistor of the first sampling branch, $R_{21}$ represents a resistance value of an upsampling resistor of the second sampling branch, and $R_{22}$ represents a resistance value of a downsampling resistor of the second sampling branch.

With reference to the first aspect, in a possible implementation, the processing unit is further configured to: control the plurality of switching switches, the first contactor, and the second contactor to be in a second working state, where the second working state is that the first switching switch and the second switching switch are turned off, the third switching switch and the fourth switching switch are turned on, and the first contactor and the second contactor are turned off; when the plurality of switching switches, the first contactor, and the second contactor are in the second working state, detect a third sampling point voltage U3 of the third switching branch and a fourth sampling point voltage U4 of the fourth switching branch; and determine the load voltage $U_{load}$ based on the third sampling point voltage U3 and the fourth sampling point voltage U4.

The processing unit controls turn-on and turn-off of the switching switches and the contactors, and collects a corresponding sampling point voltage for calculation, so that the detection apparatus may be used to detect the load voltage $U_{load}$ of the battery system, thereby improving detection efficiency of the battery system.

With reference to the first aspect, in a possible implementation, the processing unit is further configured to determine the load voltage $U_{load}$ based on the following formulas:

$$U_{load}=U_p{'}-U_n{'}$$

$$U_p{'}=U3\times(R3+R_{11}+R_{12})/R_{12}$$

$$U_n{'}=U4\times(R4+R_{21}+R_{22})R_{12}.$$

$U_p{'}$ represents a voltage at the first terminal of the load, $U_n{'}$ represents a voltage at the second terminal of the load, R3 represents a resistance value of the third switching resistor, R4 represents a resistance value of the fourth switching resistor, $R_{11}$ represents the resistance value of the upsampling resistor of the first sampling branch, $R_{12}$ represents the resistance value of the downsampling resistor of the first sampling branch, $R_{21}$ represents the resistance value of the upsampling resistor of the second sampling branch, and $R_{22}$ represents the resistance value of the downsampling resistor of the second sampling branch.

With reference to the first aspect, in a possible implementation, the processing unit is further configured to: control the plurality of switching switches to be in the first working state, where the first working state is that the first switching switch and the second switching switch are turned on, and the third switching switch and the fourth switching switch are turned off; when the plurality of switching switches are in the first working state, detect the first sampling point voltage U1 of the first switching branch and the second sampling point voltage U2 of the second switching branch; control the plurality of switching switches to be in a third working state, where the third working state is that the first switching switch is turned on, and the second switching switch to the fourth switching switch are turned off; when the plurality of switching switches are in the third working state, detect a fifth sampling point voltage U5 of the first switching branch; and determine the insulation resistance value $R_p$ to ground of the positive electrode of the battery pack and the insulation resistance value $R_n$ to ground of the negative electrode of the battery pack based on the first sampling point voltage U1, the second sampling point voltage U2, and the fifth sampling point voltage U5.

The processing unit controls turn-on and turn-off of the switching switches, and collects a corresponding sampling point voltage for calculation, so that the detection apparatus may be used to perform insulation detection on the battery system, thereby improving detection efficiency of the battery system.

With reference to the first aspect, in a possible implementation, the processing unit is further configured to determine the insulation resistance value $R_p$ to ground of the positive electrode of the battery pack and the insulation resistance value $R_n$ to ground of the negative electrode of the battery pack based on the following formulas:

$$U_{p1}/(R_p//(R1+R_{11}+R_{12}))=-U_{n1}/(R_n//(R2+R_{21}+R_{22}))$$

$$U_{p2}/(R_p//(R1+R_{11}+R_{12}))=-U_{n2}/R_n$$

$$U_{p1}=U1\times(R1+R_{11}+R_{12})/R_{12}$$

$$U_{n1}=U2\times(R2+R_{21}+R_{22})/R_{22}$$

$$U_{p2}=U5\times(R1+R_{11}+R_{12})/R_{12}$$

$$U_{n2}=U_{n1}-U_{p1}+U_{p2}.$$

$U_{p1}$ represents a positive electrode voltage of the battery pack in the first working state, $U_{n1}$ represents a negative electrode voltage of the battery pack in the first working state, $U_{p2}$ represents a positive electrode voltage of the battery pack in the third working state, $U_{n2}$ represents a negative electrode voltage of the battery pack in the third working state, R1 represents the resistance value of the first switching resistor, R2 represents the resistance value of the second switching resistor, $R_{11}$ represents the resistance value of the upsampling resistor of the first sampling branch, $R_{12}$ represents the resistance value of the downsampling resistor of the first sampling branch, $R_{21}$ represents the resistance value of the upsampling resistor of the second sampling branch, and $R_{22}$ represents the resistance value of the downsampling resistor of the second sampling branch.

With reference to the first aspect, in a possible implementation, the processing unit is further configured to: control the first switching switch to be turned on, and obtain a voltage $U_{c1}$ at the first terminal of the first contactor; control the third switching switch to be turned on, and obtain a voltage $U_{c2}$ at the second terminal of the first contactor; determine an actual working state of the first contactor based on $U_{c1}$ and $U_{c2}$; obtain an indicated working state of the first contactor, where the indicated working state is a working state that is of the first contactor and that is indicated by a contactor control signal; and obtain the contact status information of the first contactor based on whether the actual working state is consistent with the indicated working state.

The processing unit controls turn-on and turn-off of the switching switches, and collects a corresponding sampling point voltage for calculation, so that the detection apparatus may be used to perform contactor adhesion detection on the battery system, thereby improving detection efficiency of the battery system.

With reference to the first aspect, in a possible implementation, the battery system includes N battery packs, the battery pack is a first battery pack in the N battery packs, and the battery system further includes a third contactor to a $(3N-1)^{th}$ contactor, where $N\geq 2$. A positive electrode of an $i^{th}$ battery pack in the N battery packs is connected to a first terminal of a $(3i-3)^{th}$ contactor, a second terminal of the $(3i-3)^{th}$ contactor is configured to connect to the first terminal of the load, a negative electrode of the $i^{th}$ battery pack is connected to a first terminal of a $(3i-2)^{th}$ contactor, a second terminal of the $(3i-2)^{th}$ contactor is connected to the second terminal of the load, and a $(3i-1)^{th}$ contactor is disposed between the positive electrode of the $i^{th}$ battery pack and a negative electrode of an $(i-1)^{th}$ battery pack, where $2\leq i\leq N$. The plurality of switching switches further include a fifth switching switch to a $(2N+2)^{th}$ switching switch, and the plurality of switching branches further include a fifth switching branch to a $(2N+2)^{th}$ switching branch. A $(2i+1)^{h}$ switching branch includes a $(2i+1)^{h}$ switching resistor, and a $(2i+1)^{th}$ switching switch is configured to control the $(2i+1)^{th}$ switching branch to be switched in or out between the positive electrode of the $i^{th}$ battery pack and the reference ground. A $(2i+2)^{th}$ switching branch includes a $(2i+2)^{th}$ switching resistor, and a $(2i+2)^{th}$ switching switch is configured to control the $(2i+2)^{th}$ switching branch to be switched in or out between the negative electrode of the $i^{th}$ battery pack and the reference ground.

The switching branches in the switching unit of the detection apparatus for the battery system may be extended based on a quantity and a connection manner of the battery packs in the to-be-detected battery system, to implement high-voltage detection and insulation detection of the battery system including a plurality of battery packs by using one set of circuits, so that the circuit design can be optimized, and circuit detection efficiency can be improved.

With reference to the first aspect, in a possible implementation, the plurality of sampling branches include the first sampling branch and the second sampling branch. The first terminal of the first sampling branch is connected to a second terminal of the $(2i+1)^{th}$ switching branch. The first terminal of the second sampling branch is connected to a second terminal of the $(2i+2)^{th}$ switching branch.

According to a second aspect, a detection method for a battery system is provided. The battery system includes a battery pack, a first contactor, and a second contactor. A first terminal of the first contactor is connected to a positive electrode of the battery pack, a first terminal of the second contactor is connected to a negative electrode of the battery pack, a second terminal of the first contactor is configured to connect to a first terminal of a load, and a second terminal of the second contactor is configured to connect to a second terminal of the load. The method is performed by a detection apparatus, the detection apparatus includes a switching unit and a processing unit, and the processing unit includes a plurality of switching branches and a plurality of switching switches, where each of the plurality of switching branches includes a switching resistor, and the plurality of switching switches are configured to control the plurality of switching branches to be switched in or out between the following plurality of terminals and a reference ground: the positive electrode of the battery pack, the second terminal of the first contactor, the negative electrode of the battery pack, and the second terminal of the second contactor, where the reference ground is configured to connect to a vehicle body ground. The method includes: The processing unit detects sampling point voltage information of the plurality of switching branches, where the sampling point voltage information is used to indicate sampling point voltages of the plurality of switching branches; and the processing unit determines high-voltage detection information and insulation detection information based on the sampling point voltage information, where the high-voltage detection information includes at least one of the following: a battery pack voltage $U_{bat}$ and a load voltage $U_{load}$, and the insulation detection information includes at least one of the following: an insulation resistance value $R_p$ to ground of the positive electrode of the battery pack and an insulation resistance value $R_n$ to ground of the negative electrode of the battery pack.

The switching unit is disposed in the detection apparatus for the battery system, and the plurality of switching branches in the switching unit may be flexibly switched in or out between a plurality of terminals in the battery system and the reference ground. By using the plurality of switching branches, the detection apparatus 200 may detect sampling point voltages of the plurality of switching branches in different statuses, to implement high-voltage detection and insulation detection of the battery system. Because the reference ground of the plurality of switching branches in the switching unit is configured to connect to the vehicle body ground, electric isolation may not need to be performed for high-voltage detection and insulation detection inside the detection apparatus, and high-voltage detection and insulation detection of the battery system are implemented by using one set of circuits, so that a circuit design can be optimized, and detection efficiency of the battery system can be improved.

With reference to the second aspect, in a possible implementation, the method further includes: The processing unit determines at least one of the following information based on the sampling point voltage information: contact status information of the first contactor and contact status information of the second contactor, where the contact status information is used to indicate whether a contact of the contactor is adhered to.

With reference to the second aspect, in a possible implementation, the switching unit further includes a plurality of sampling branches, a first terminal of each of the plurality of sampling branches is connected to a second terminal of at least one of the plurality of switching branches, and a second terminal of each of the plurality of sampling branches is connected to the reference ground.

With reference to the second aspect, in a possible implementation, each of the plurality of sampling branches includes an upsampling resistor and a downsampling resistor, a first terminal of the upsampling resistor is connected to the first terminal of each sampling branch, a second terminal of the upsampling resistor is connected to a first terminal of the downsampling resistor, and a second terminal of the downsampling resistor is connected to the reference ground, where a sampling point voltage of the switching branch is a voltage at the second terminal of the upsampling resistor.

With reference to the second aspect, in a possible implementation, the plurality of switching branches include a first switching branch to a fourth switching branch, and the plurality of switching switches include a first switching switch to a fourth switching switch. The first switching branch includes a first switching resistor, and the first switching switch is configured to control the first switching branch to be switched in or out between the positive electrode of the battery pack and the reference ground. The second switching branch includes a second switching resistor, and the second switching switch is configured to control the second switching branch to be switched in or out between the negative electrode of the battery pack and the reference ground. The third switching branch includes a third switching resistor, and the third switching switch is configured to control the third switching branch to be switched in or out between the second terminal of the first contactor and the reference ground. The fourth switching branch includes a fourth switching resistor, and the fourth switching switch is configured to control the fourth switching branch to be switched in or out between the second terminal of the second contactor and the reference ground.

With reference to the second aspect, in a possible implementation, the plurality of sampling branches include a first sampling branch and a second sampling branch. A first terminal of the first sampling branch is connected to a second terminal of the first switching branch and a second terminal of the third switching branch. A second terminal of the second sampling branch is connected to a second terminal of the second switching branch and a second terminal of the fourth switching branch.

With reference to the second aspect, in a possible implementation, that the processing unit determines high-voltage detection information and insulation detection information based on the sampling point voltage information includes: The processing unit controls the plurality of switching switches to be in a first working state, where the first working state is that the first switching switch and the second switching switch are turned on, and the third switching switch and the fourth switching switch are turned off; when the plurality of switching switches are in the first working state, the processing unit detects a first sampling point voltage U1 of the first switching branch and a second sampling point voltage U2 of the second switching branch; and the processing unit determines the battery pack voltage $U_{bat}$ based on the first sampling point voltage U1 and the second sampling point voltage U2.

With reference to the second aspect, in a possible implementation, that the processing unit determines the battery pack voltage $U_{bat}$ based on the first sampling point voltage U1 and the second sampling point voltage U2 includes: The processing unit determines the battery pack voltage $U_{bat}$ based on the following formulas:

$$U_{bat}=U_p-U_n$$

$$U_p=U1\times(R1+R_{11}+R_{12})/R_{12}$$

$$U_n=U2\times(R2+R_{21}+R_{22})/R_{22}.$$

$U_p$ represents a positive electrode voltage of the battery pack, $U_n$ represents a negative electrode voltage of the battery pack, R1 represents a resistance value of the first switching resistor, R2 represents a resistance value of the second switching resistor, $R_{11}$ represents a resistance value of an upsampling resistor of the first sampling branch, $R_{12}$ represents a resistance value of a downsampling resistor of the first sampling branch, $R_{21}$ represents a resistance value of an upsampling resistor of the second sampling branch, and $R_{22}$ represents a resistance value of a downsampling resistor of the second sampling branch.

With reference to the second aspect, in a possible implementation, that the processing unit determines high-voltage detection information and insulation detection information based on the sampling point voltage information includes: The processing unit controls the plurality of switching switches, the first contactor, and the second contactor to be in a second working state, where the second working state is that the first switching switch and the second switching switch are turned off, the third switching switch and the fourth switching switch are turned on, and the first contactor and the second contactor are turned off; when the plurality of switching switches, the first contactor, and the second contactor are in the second working state, the processing unit detects a third sampling point voltage U3 of the third switching branch and a fourth sampling point voltage U4 of the fourth switching branch; and the processing unit determines the load voltage $U_{load}$ based on the third sampling point voltage U3 and the fourth sampling point voltage U4.

With reference to the second aspect, in a possible implementation, that the processing unit determines the load voltage $U_{load}$ based on the third sampling point voltage U3 and the fourth sampling point voltage U4 includes: The processing unit determines the load voltage $U_{load}$ based on the following formulas:

$$U_{load} = U_p' - U_n'$$

$$U_p' = U3 \times (R3 + R_{11} + R_{12})/R_{12}$$

$$U_n' = U4 \times (R4 + R_{21} + R_{22})R_{12}.$$

$U_p'$ represents a voltage at the first terminal of the load, $U_n'$ represents a voltage at the second terminal of the load, R3 represents a resistance value of the third switching resistor, R4 represents a resistance value of the fourth switching resistor, $R_{11}$ represents the resistance value of the upsampling resistor of the first sampling branch, $R_{12}$ represents the resistance value of the downsampling resistor of the first sampling branch, $R_{21}$ represents the resistance value of the upsampling resistor of the second sampling branch, and $R_{22}$ represents the resistance value of the downsampling resistor of the second sampling branch.

With reference to the second aspect, in a possible implementation, that the processing unit determines high-voltage detection information and insulation detection information based on the sampling point voltage information includes: The processing unit controls the plurality of switching switches to be in the first working state, where the first working state is that the first switching switch and the second switching switch are turned on, and the third switching switch and the fourth switching switch are turned off; when the plurality of switching switches are in the first working state, the processing unit detects the first sampling point voltage U1 of the first switching branch and the second sampling point voltage U2 of the second switching branch; the processing unit controls the plurality of switching switches to be in a third working state, where the third working state is that the first switching switch is turned on, and the second switching switch to the fourth switching switch are turned off; when the plurality of switching switches are in the third working state, the processing unit detects a fifth sampling point voltage U5 of the first switching branch; and the processing unit determines the insulation resistance value $R_p$ to ground of the positive electrode of the battery pack and the insulation resistance value $R_n$ to ground of the negative electrode of the battery pack based on the first sampling point voltage U1, the second sampling point voltage U2, and the fifth sampling point voltage U5.

With reference to the second aspect, in a possible implementation, that the processing unit determines the insulation resistance value $R_p$ to ground of the positive electrode of the battery pack and the insulation resistance value $R_n$ to ground of the negative electrode of the battery pack based on the first sampling point voltage U1, the second sampling point voltage U2, and the fifth sampling point voltage U5 includes: The processing unit determines the insulation resistance value $R_p$ to ground of the positive electrode of the battery pack and the insulation resistance value $R_n$ to ground of the negative electrode of the battery pack based on the following formulas:

$$U_{p1}/(R_p//(R1+R_{11}+R_{12})) = -U_{n1}/(R_n//(R2+R_{21}+R_{22}))$$

$$U_{p2}/(R_p//(R1+R_{11}+R_{12})) = -U_{n2}/R_n$$

$$U_{p1} = U1 \times (R1+R_{11}+R_{12})/R_{12}$$

$$U_{n1} = U2 \times (R2+R_{21}+R_{22})/R_{22}$$

$$U_{p2} = U5 \times (R1+R_{11}+R_{12})/R_{12}$$

$$U_{n2} = U_{n1} - U_{p1} + U_{p2}.$$

$U_{p1}$ represents a positive electrode voltage of the battery pack in the first working state, $U_{n1}$ represents a negative electrode voltage of the battery pack in the first working state, $U_{p2}$ represents a positive electrode voltage of the battery pack in the third working state, $U_{n2}$ represents a negative electrode voltage of the battery pack in the third working state, R1 represents the resistance value of the first switching resistor, R2 represents the resistance value of the second switching resistor, $R_{11}$ represents the resistance value of the upsampling resistor of the first sampling branch, $R_{12}$ represents the resistance value of the downsampling resistor of the first sampling branch, $R_{21}$ represents the resistance value of the upsampling resistor of the second sampling branch, and $R_{22}$ represents the resistance value of the downsampling resistor of the second sampling branch.

With reference to the second aspect, in a possible implementation, the method further includes: The processing unit controls the first switching switch to be turned on, and obtains a voltage $U_{c1}$ at the first terminal of the first contactor; the processing unit controls the third switching switch to be turned on, and obtains a voltage $U_{c2}$ at the second terminal of the first contactor; the processing unit determines an actual working state of the first contactor based on $U_{c1}$ and $U_{c2}$; the processing unit obtains an indicated working state of the first contactor, where the indicated working state is a working state that is of the first contactor and that is indicated by a contactor control signal; and the processing unit obtains the contact status information of the first contactor based on whether the actual working state is consistent with the indicated working state.

With reference to the second aspect, in a possible implementation, the battery system includes N battery packs, the battery pack is a first battery pack in the N battery packs, and the battery system further includes a third contactor to a $(3N-1)^{th}$ contactor, where N≥2. A positive electrode of an $i^{th}$ battery pack in the N battery packs is connected to a first terminal of a $(3i-3)^{th}$ contactor, a second terminal of the $(3i-3)^{th}$ contactor is configured to connect to the first terminal of the load, a negative electrode of the $i^{th}$ battery pack is connected to a first terminal of a (3i-2)th contactor, a second terminal of the $(3i-2)^{th}$ contactor is connected to the second terminal of the load, and a $(3i-1)^{th}$ contactor is disposed between the positive electrode of the $i^{th}$ battery pack and a negative electrode of an $(i-1)^{th}$ battery pack, where 2≤i≤N. The plurality of switching switches further include a fifth switching switch to a $(2N+2)^{th}$ switching switch, and the plurality of switching branches further include a fifth switching branch to a $(2N+2)^{th}$ switching branch. A $(2i+1)^{th}$ switching branch includes a $(2i+1)^{th}$ switching resistor, and a $(2i+1)^{th}$ switching switch is configured to control the $(2i+1)^{th}$ switching branch to be switched in or out between the positive electrode of the $i^{th}$ battery pack and the reference ground. A $(2i+2)^{th}$ switching branch includes a $(2i+2)^{th}$ switching resistor, and a $(2i+2)^{th}$ switching switch is configured to control the (2i+2)th switching branch to be switched in or out between the negative electrode of the $i^{th}$ battery pack and the reference ground.

With reference to the second aspect, in a possible implementation, the plurality of sampling branches include the first sampling branch and the second sampling branch. The first terminal of the first sampling branch is connected to a second terminal of the $(2i+1)^{th}$ switching branch. The first terminal of the second sampling branch is connected to a second terminal of the $(2i+2)^{th}$ switching branch.

According to a third aspect, a power management system is provided. The power management system includes the detection apparatus according to any one of the first aspect or the possible implementations of the first aspect.

According to a fourth aspect, an automotive system is provided. The automotive system includes the detection apparatus according to any one of the first aspect or the first aspect.

BRIEF DESCRIPTION OF THE DRAWINGS

FIG. 4 is a flowchart of a high-voltage detection method for a battery pack voltage Ubat of a battery system according to an embodiment.

FIG. 5 is a flowchart of a high-voltage detection method for a load voltage Uload of a battery system according to an embodiment.

FIG. 6 is a flowchart of an insulation detection method for a battery system according to an embodiment.

DETAILED DESCRIPTION

The following describes technical solutions with reference to accompanying drawings.

For ease of understanding, some terms in embodiments are first described.

Contactor: refers to an apparatus that can quickly disconnect alternating current and direct current main circuits and frequently connect and disconnect a high-current control circuit in electrical engineering. The contactor is one of important components in an automatic control system because of a large control capacity, which is suitable for frequent operations and remote control. Contactors include alternating current contactors and direct current contactors, and may be used in power supply, power distribution, and power consumption scenarios. In embodiments, because output of a battery system is a direct current, the contactor may be a direct current contactor.

Battery management system (BMS): refers to a control system configured to monitor and manage a battery system, and is usually applied to power battery system management in an electric vehicle. The BMS can implement a plurality of functions such as battery monitoring, calculation, and communication.

Figure 1:
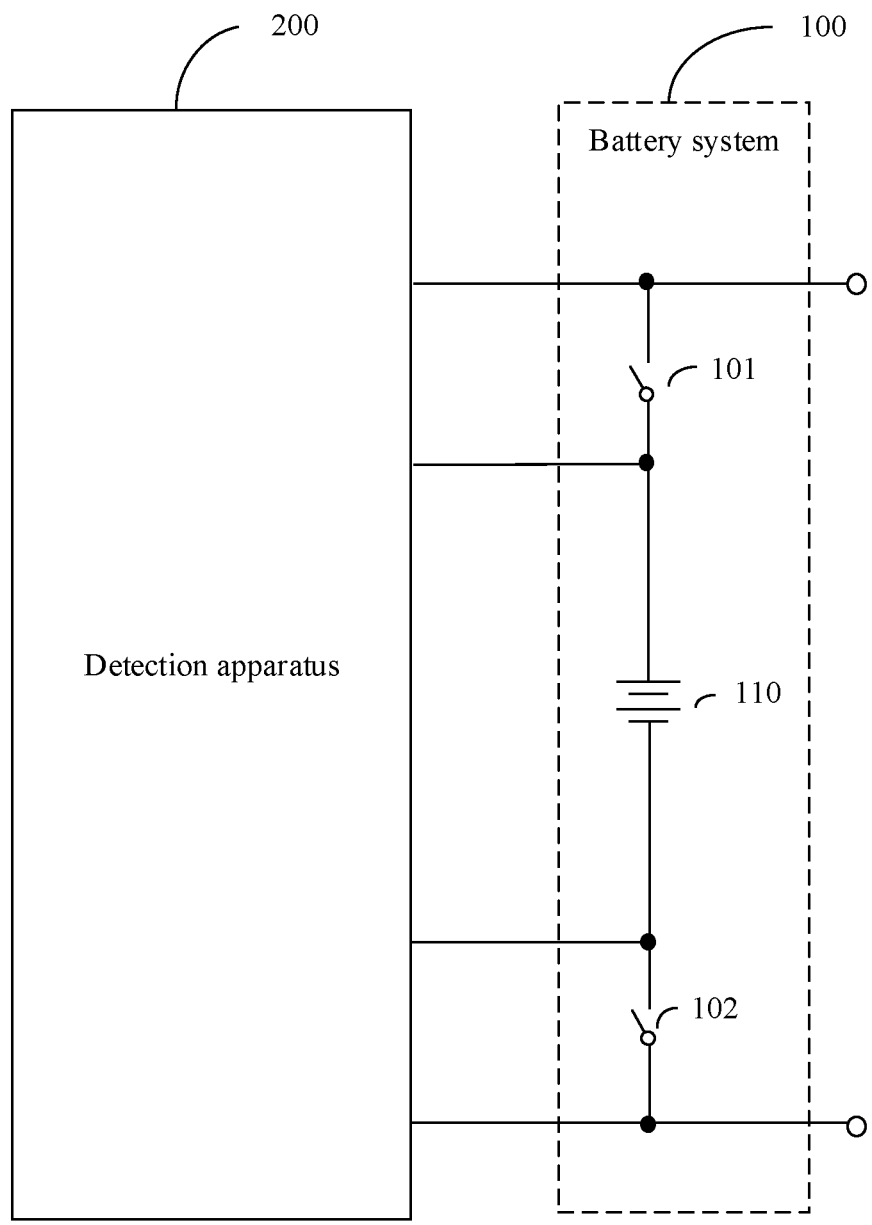
FIG. 1 is a schematic diagram of a scenario according to an embodiment.

FIG. 1 is a schematic diagram of a scenario according to an embodiment. As shown in FIG. 1, the scenario includes a battery system 100 and a detection apparatus 200. The battery system 100 includes a battery pack 110, a first contactor 101, and a second contactor 102. The first contactor 101 and the second contactor 102 are used as control switches for external output of the battery system 100, that is, control connection and disconnection of an external output circuit of the battery pack 110. A first terminal of the first contactor 101 is connected to a positive electrode of the battery pack 110. A second terminal of the first contactor 101 is configured to connect to a positive electrode of an output end of the battery system 100, or in other words, is configured to connect to a first terminal of a load (not shown in the figure). A first terminal of the second contactor 102 is connected to a negative electrode of the battery pack 110. A second terminal of the second contactor 102 is connected to a negative electrode of the output end of the battery system 100, or in other words, is configured to connect to a second terminal of the load.

In some examples, the battery system 100 is a high-voltage battery system. Because the contactors are applied to the high-voltage battery system, the contactors are usually contactors that can withstand a high-voltage and a high current.

It should be understood that the components in the battery system 100 shown in FIG. 1 are merely used as examples. In practice, the battery system 100 may further include a plurality of battery packs 110 and a plurality of contactors, or may include another component or functional module that is not shown in FIG. 1.

It should be understood that the battery system 100 in FIG. 1 may be applied to an electric vehicle, an intelligent vehicle, or a hybrid electric vehicle, or may be applied to another field.

As shown in FIG. 1, the detection apparatus 200 is connected to the battery system 100, and is configured to implement high-voltage detection and insulation detection in the battery system 100.

Further, the detection apparatus 200 may further implement contactor adhesion detection of the battery system 100. Contactor adhesion detection refers to detecting whether a contact of a contactor is adhered to. When a mechanical contact of the contactor is disconnected under load, a contact adhesion fault may occur. As a result, high-voltage output cannot be cut off. Therefore, adhesion detection further needs to be performed on the contact of the contactor.

It should be understood that the detection apparatus 200 may be an independent module, or may be integrated with another functional circuit. For example, the detection apparatus 200 may be integrated into a BMS.

For ease of understanding, the following separately describes principles of high-voltage detection, insulation detection, and contact adhesion detection of a contactor.

High-voltage detection principle: is used to calculate a battery pack voltage $U_{bat}$ or a load voltage $U_{load}$ based on voltage information collected from the high-voltage battery system. For example, a voltage at two ends of the battery pack 110 may refer to a voltage difference between the first terminal of the first contactor 101 and the first terminal of the second contactor 102. The load voltage may refer to a voltage difference between the second terminal of the first contactor 101 and the second terminal of the second contactor 102.

Insulation detection principle: Insulation detection is used to separately detect insulation resistance $R_p$ to ground of the positive electrode of the battery pack 110 and insulation resistance $R_n$ to ground of the negative electrode of the battery pack 110. Specifically, a switching resistor may be switched in or out between the positive electrode (and/or the negative electrode) of the battery pack 110 and a vehicle body ground, and voltages to the vehicle body ground of the positive electrode (and/or the negative electrode) of the battery pack 110 may be separately calculated when the switching resistor is switched in or out. Then, equations are listed by using a Kirchhoff's current law, to calculate the insulation resistance $R_p$ to ground of the positive electrode of the battery pack 110 and the insulation resistance $R_n$ to ground of the negative electrode of the battery pack 110.

Contactor adhesion detection principle: A current working state of a contactor is obtained by comparing data of voltages at two ends of the contactor that is collected through high-voltage detection, and then it is determined whether the current working state of the contactor is the same as a working state that is of the contactor and that is indicated by a contactor control signal sent by the detection apparatus 200. If the current working state is the same as the indicated working state, it indicates that a contact of the contactor is not adhered to. If the current working state is different from the indicated working state, it indicates that the contact of the contactor is adhered to.

Figure 2:
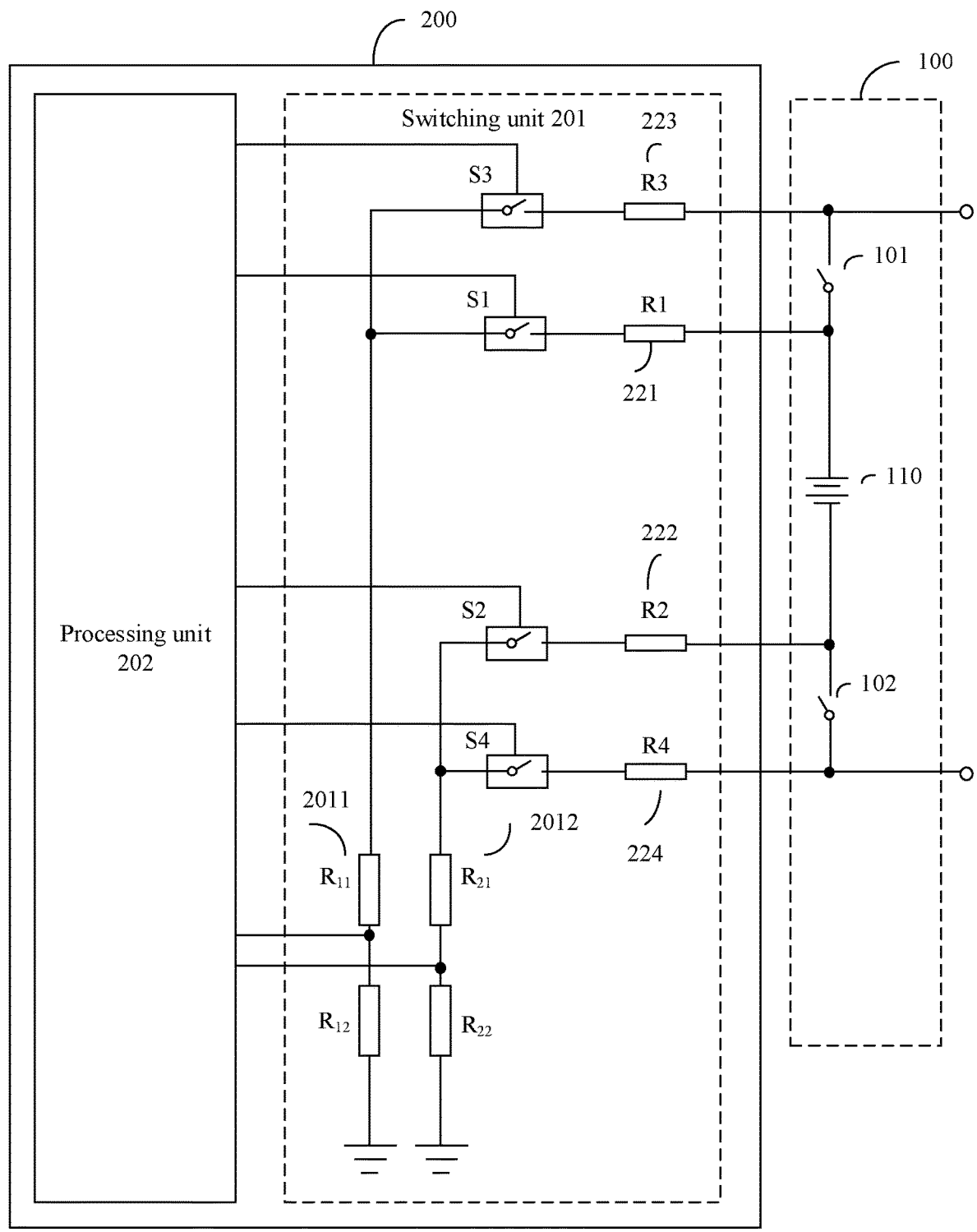
FIG. 2 is a schematic diagram of a structure of a detection apparatus according to an embodiment.

FIG. 2 is a schematic diagram of a structure of a detection apparatus 200 according to an embodiment. As shown in FIG. 2, the detection apparatus 200 includes a switching unit 201 and a processing unit 202.

The switching unit 201 includes a plurality of switching branches (221 to 224) and a plurality of switching switches (S1 to S4), where each of the plurality of switching branches includes a switching resistor (R1 to R4), and the plurality of switching switches (S1 to S4) are configured to control the plurality of switching branches to be switched in or out between the following plurality of terminals and a reference ground: a positive electrode of a battery pack 110, a second terminal of a first contactor 101, a negative electrode of the battery pack 110, and a second terminal of a second contactor 102, where the reference ground is configured to connect to a vehicle body ground.

In some examples, the processing unit 202 may send a switching control signal to each of the plurality of switching switches (S1 to S4), and the processing unit 202 may control, by using the switching control signal, turn-on or turn-off of each switching switch.

In some examples, the processing unit 202 may further send a contactor control signal to the first contactor 101 or the second contactor 102, and the contactor control signal is used to control turn-on or turn-off of each contactor.

It may be understood that, after a switching switch (S1 to S4) corresponding to a switching branch is turned on, a switching resistor (R1 to R4) in the switching branch is switched in between a corresponding terminal and the reference ground. After the switching switch (S1 to S4) corresponding to the switching branch is turned off, the switching resistor (R1 to R4) is disconnected from the corresponding terminal.

Optionally, in this embodiment, resistance values of the switching resistors (R1 to R4) in the plurality of switching branches are not limited, and the resistance values of the switching resistors (R1 to R4) may be determined based on practice. In an example, relatively large resistance values, for example, resistance in a megohm (MΩ) level, may be generally used as the resistance values of the switching resistors (R1 to R4).

It should be understood that the switching branch may include one or more switching resistors. The following uses an example in which one switching resistor is disposed in each switching branch for description.

In an example, the switching switch may include at least one of the following switch components: a relay, an opto-isolator (e.g., PhotoMOS), and a metal-oxide-semiconductor field-effect transistor (MOSFET).

The processing unit 202 is configured to detect sampling point voltage information of the plurality of switching branches, where the sampling point voltage information is used to indicate sampling point voltages of the plurality of switching branches.

It should be understood that, based on different detection purposes of the detection apparatus 200, for example, high-voltage detection, insulation detection, or contactor adhesion detection, on/off statuses of the plurality of switching switches (S1 to S4) corresponding to the sampling point voltage information are also different. In other words, the sampling point voltage information includes sampling point voltages of the plurality of switching branches in different on/off statuses of the plurality of switching switches (S1 to S4). The following further describes implementations of different detection methods.

The processing unit 202 is configured to: obtain sampling point voltage information from a sampling unit, and determine high-voltage detection information and insulation detection information based on the sampling point voltage information, where the high-voltage detection information includes at least one of the following: a battery pack voltage $U_{bat}$ and a load voltage $U_{load}$, and the insulation detection information includes at least one of the following: an insulation resistance value $R_p$ to ground of the positive electrode of the battery pack 110 and an insulation resistance value $R_n$ to ground of the negative electrode of the battery pack 110.

In this embodiment, the switching unit is disposed in the detection apparatus for a battery system, and the plurality of switching branches in the switching unit may be flexibly switched in or out between a plurality of terminals in the battery system and the reference ground. By using the plurality of switching branches, the detection apparatus 200 may detect sampling point voltages of the plurality of switching branches in different statuses, to implement high-voltage detection and insulation detection of the battery system. Because the reference ground of the plurality of switching branches in the switching unit is configured to connect to the vehicle body ground, electric isolation may not need to be performed for high-voltage detection and insulation detection inside the detection apparatus, and high-voltage detection and insulation detection of the battery system are implemented by using one set of circuits, so that a circuit design can be optimized, and detection efficiency of the battery system can be improved.

Further, the processing unit 202 is further configured to determine at least one of the following information based on the sampling point voltage information: contact status information of the first contactor 101 and contact status information of the second contactor 102, where the contact status information is used to indicate whether a contact of the contactor is adhered to.

Still refer to FIG. 2. In an example, the plurality of switching branches include a first switching branch to a fourth switching branch (221 to 224), the plurality of switching switches include a first switching switch S1 to a fourth switching switch S4, and the plurality of switching branches are in a one-to-one correspondence with the plurality of switching switches.

The first switching branch 221 includes a first switching resistor R1, the first switching switch S1 is connected in series to the first switching resistor R1, a first terminal of the first switching branch 221 is connected to the positive electrode of the battery pack 110, and the first switching switch S1 is configured to control the first switching branch 221 to be switched in or out between the positive electrode of the battery pack 110 and the reference ground.

The second switching branch 222 includes a second switching resistor R2, the second switching switch S2 is connected in series to the second switching resistor R2, a first terminal of the second switching branch 222 is connected to the negative electrode of the battery pack 110, and the second switching switch S2 is configured to control the second switching branch 222 to be switched in or out between the negative electrode of the battery pack 110 and the reference ground.

The third switching branch 223 includes a third switching resistor R3, the third switching switch S3 is connected in series to the third switching resistor R3, a first terminal of the third switching branch 223 is connected to the second terminal of the first contactor 101, and the third switching switch S3 is configured to control the third switching branch 223 to be switched in or out between the second terminal of the first contactor 101 and the reference ground.

The fourth switching branch 224 includes a fourth switching resistor R4, the fourth switching switch S4 is connected in series to the fourth switching resistor R4, a first terminal of the fourth switching branch 224 is connected to the second terminal of the second contactor 102, and the fourth switching switch S4 is configured to control the fourth switching branch 224 to be switched in or out between the second terminal of the second contactor 102 and the reference ground.

Still refer to FIG. 2. The switching unit 201 further includes a plurality of sampling branches (2011 and 2012), and the plurality of sampling branches are configured to provide sampling point voltages corresponding to the switching branches. Optionally, the sampling branches may be disposed between the plurality of switching branches and the reference ground. For example, a first terminal of each of the plurality of sampling branches is connected to a second terminal of at least one of the plurality of switching branches, and a second terminal of each sampling branch is connected to the reference ground.

In an example, in FIG. 2, an example in which the plurality of sampling branches include two sampling branches (2011 and 2012) is used for description. A first terminal of a first sampling branch 2011 is connected to a second terminal of the first switching branch 221 and a second terminal of the third switching branch 223. A first terminal of a second sampling branch 2012 is connected to a second terminal of the second switching branch 222 and a second terminal of the fourth switching branch 224.

It should be understood that connections between components or circuits in this embodiment may include a direct connection and an indirect connection. In a case of an indirect connection, another component may be disposed between the components or the circuits.

Still refer to FIG. 2. In some examples, each of the plurality of sampling branches includes an upsampling resistor ($R_{11}$ and $R_{21}$) and a downsampling resistor ($R_{12}$ and $R_{22}$), a first terminal of the upsampling resistor ($R_{11}$ and $R_{21}$) is connected to the first terminal of each sampling branch, a second terminal of the upsampling resistor ($R_{11}$ and $R_{21}$) is connected to a first terminal of the downsampling resistor ($R_{12}$ and $R_{22}$), and a second terminal of the downsampling resistor ($R_{12}$ and $R_{22}$) is connected to the reference ground, where a sampling point voltage of the switching branch is a voltage at the second terminal of the upsampling resistor ($R_{12}$ and $R_{22}$).

It should be understood that, in FIG. 2, both the first switching branch 221 and the third switching branch 223 correspond to the first sampling branch 2011. When the first switching switch S1 is turned on and the third switching switch S3 is turned off, the first switching branch 221 is switched into a circuit, and a sampling point voltage detected by using the first sampling branch 2011 is a sampling point voltage corresponding to the first switching branch 221. When the first switching switch S1 is turned off and the third switching switch S3 is turned on, the third switching branch 223 is switched into the circuit, and a sampling point voltage detected by using the second sampling branch is a sampling point voltage corresponding to the third switching branch 223. Similarly, both the second switching branch 222 and the fourth switching branch 224 correspond to the second sampling branch 2012.

In some examples, after obtaining the sampling point voltage of the switching branch, the processing unit 202 may calculate, based on a voltage division principle, a voltage at a terminal corresponding to the switching branch, for example, calculate a voltage of the positive electrode or the negative electrode of the battery pack.

It should be understood that the sampling branch in FIG. 2 is merely an example rather than a limitation. The sampling branch may alternatively be implemented in another manner, provided that the sampling branch can implement a function of providing the sampling point voltage of the switching branch. For example, the switching unit 201 in FIG. 2 may include four sampling branches, and the four sampling branches are in a one-to-one correspondence with the four switching branches.

It should be understood that FIG. 2 is merely used as an example of a specific implementation of the detection apparatus 200, and the switching unit 201 may alternatively be implemented in another manner, provided that the switching unit 201 can implement switching in and switching out between a plurality of switching branches and a plurality of terminals in the battery system, and a reference ground of the plurality of switching branches is the vehicle body ground. For example, FIG. 3 shows another implementation of the detection apparatus 200.

Figure 3:
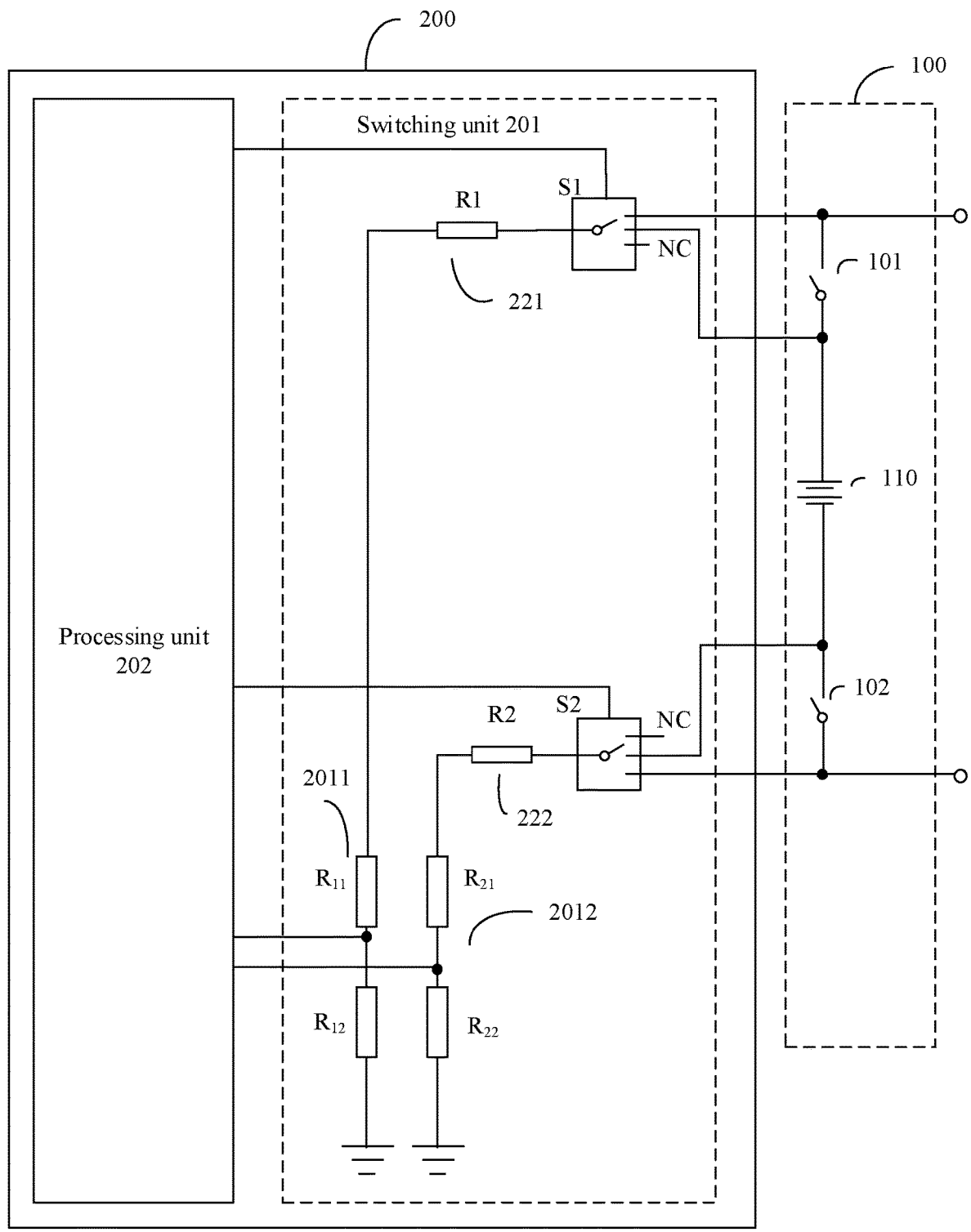
FIG. 3 is a schematic diagram of a structure of a detection apparatus according to another embodiment.

FIG. 3 is a schematic diagram of a structure of a detection apparatus 200 according to another embodiment. As shown in FIG. 3, the switching branches include a first switching branch 221 and a second switching branch 222, the plurality of switching resistors include a first switching resistor R1 and a second switching resistor R2, and the plurality of switching switches include a first switching switch S1 and a second switching switch S2. The first switching switch S1 and the second switching switch S2 are single-pole multi-throw switches.

The first switching branch 221 includes the first switching resistor R1, a first terminal of the first switching switch S1 is connected to a first terminal of the first switching branch 221, and a second terminal of the first switching switch S1 is connected to the following plurality of terminals: the positive electrode of the battery pack 110, the second terminal of the first contactor 101, and an unconnected terminal (NC).

The second switching branch 222 includes the second switching resistor R2, a second terminal of the second switching switch S2 is connected to a first terminal of the second switching branch 222, and a second terminal of the second switching switch S2 is connected to the following plurality of terminals: the negative electrode of the battery pack 110, the second terminal of the second contactor 102, and an unconnected terminal (NC).

The unconnected terminal may mean that the second terminal of the switching switch is not connected to any potential, and is in a disconnected state.

With reference to the detection apparatus 200 shown in FIG. 2, the following describes in detail a high-voltage detection method, an insulation detection method, and a contact adhesion detection method for a contactor in embodiments.

FIG. 4 is a flowchart of a high-voltage detection method for a battery pack voltage $U_{bat}$ according to an embodiment. As shown in FIG. 4, the method includes the following steps.

S401: The processing unit 202 controls the plurality of switching switches to be in a first working state, where the first working state is that the first switching switch S1 and the second switching switch S2 are turned on, and the third switching switch S3 and the fourth switching switch S4 are turned off.

In an example, the processing unit 202 may separately send switching control signals to the plurality of switching switches, where the switching control signals are used to control turn-on and turn-off of the switches. In this case, the positive electrode of the battery pack is connected to the reference ground by using the first switching branch 221, and the negative electrode of the battery pack is connected to the reference ground by using the second switching branch 222.

S402: When the plurality of switching switches are in the first working state, the processing unit 202 detects a first sampling point voltage U1 of the first switching branch 221 and a second sampling point voltage U2 of the second switching branch 222.

Specifically, the first sampling point voltage U1 is a voltage at the second terminal of the upsampling resistor $R_{11}$ in the first sampling branch 2011, and the second sampling point voltage U2 is a voltage at the second terminal of the upsampling resistor $R_{21}$ in the second sampling branch 2012.

S403: The processing unit 202 determines the battery pack voltage $U_{bat}$ based on the first sampling point voltage U1 and the second sampling point voltage U2.

Specifically, the processing unit 202 may calculate a positive electrode voltage $U_p$ and a negative electrode voltage $U_n$ of the battery pack based on a voltage division law, and further calculate the battery pack voltage $U_{bat}$. Formulas are as follows:

$$U_{bat}=U_p-U_n; \quad (1)$$

$$U_p=U1\times(R1+R_{11}+R_{12})/R_{12}; \quad (2)$$

$$U_n=U2\times(R2+R_{21}+R_{22})/R_{22}; \quad (3)$$

herein, $U_p$ represents the positive electrode voltage of the battery pack, $U_n$ represents the negative electrode voltage of the battery pack, R1 represents a resistance value of the first switching resistor R1, R2 represents a resistance value of the second switching resistor R2, $R_{11}$ represents a resistance value of the upsampling resistor $R_{11}$ of the first sampling branch 2011, $R_{12}$ represents a resistance value of the downsampling resistor $R_{12}$ of the first sampling branch 2011, $R_{21}$ represents a resistance value of the upsampling resistor $R_{21}$ of the second sampling branch 2012, and $R_{22}$ represents a resistance value of the downsampling resistor $R_{22}$ of the second sampling branch 2012.

FIG. 5 is a flowchart of a high-voltage detection method for a load voltage $U_{load}$ of a battery system according to an embodiment. As shown in FIG. 5, the method includes the following steps.

S501: The processing unit 202 controls the plurality of switching switches, the first contactor 101, and the second contactor 102 to be in a second working state, where the second working state is that the first switching switch S1 and the second switching switch S2 are turned off, the third switching switch S3 and the fourth switching switch S4 are turned on, and the first contactor 101 and the second contactor 102 are turned off.

In this case, the second terminal of the first contactor 101 is connected to the reference ground by using the first switching branch 221, and the second terminal of the second contactor 102 is connected to the reference ground by using the second switching branch 222.

In an example, the processing unit 202 may separately send switching control signals to the plurality of switching switches, where the switching control signals are used to control turn-on and turn-off of the switches.

In an example, the processing unit 202 may send contactor control signals to the first contactor 101 and the second contactor 102 to control the first contactor 101 and the second contactor 102 to be in an open state, to detect the load voltage.

S502: When the plurality of switching switches are in the second working state, the processing unit 202 detects a third sampling point voltage U3 of the third switching branch 223 and a fourth sampling point voltage U4 of the fourth switching branch 224.

Specifically, the third sampling point voltage U3 is a voltage at the second terminal of the upsampling resistor $R_{11}$ in the first sampling branch 2011, and the fourth sampling point voltage U4 is a voltage at the second terminal of the upsampling resistor $R_{21}$ in the second sampling branch 2012.

S503: The processing unit 202 determines the load voltage $U_{load}$ based on the third sampling point voltage U3 and the fourth sampling point voltage U4.

In an example, the processing unit 202 may calculate a voltage $U_p'$ at a first terminal of a load and a voltage $U_n'$ at a second terminal of the load based on a voltage division law, and further calculate the load voltage $U_{load}$. Formulas are as follows:

$$U_{load}=U_p'-U_n'; \quad (4)$$

$$U_p'=U3\times(R3+R_{11}+R_{12})/R_{12}; \quad (5)$$

$$U_n'=U4\times(R4+R_{21}+R_{22})R_{12}; \quad (6)$$

herein, $U_p'$ represents the voltage at the first terminal of the load, $U_n'$ represents the voltage at the second terminal of the load, R3 represents a resistance value of the third switching resistor R3, R4 represents a resistance value of the fourth switching resistor R4, $R_{11}$ represents the resistance value of the upsampling resistor $R_1$ of the first sampling branch 2011, $R_{12}$ represents the resistance value of the downsampling resistor $R_{12}$ of the first sampling branch 2011, $R_{21}$ represents the resistance value of the upsampling resistor $R_{21}$ of the second sampling branch 2012, and $R_{22}$ represents the resistance value of the downsampling resistor $R_{22}$ of the second sampling branch 2012.

FIG. 6 is a flowchart of an insulation detection method for a battery system according to an embodiment. As shown in FIG. 6, the method includes the following steps.

S601: The processing unit 202 controls the plurality of switching switches to be in a first working state, where the first working state is that the first switching switch S1 and the second switching switch S2 are turned on, and the third switching switch S3 and the fourth switching switch S4 are turned off.

S602: When the plurality of switching switches are in the first working state, the processing unit 202 detects a first sampling point voltage U1 of the first switching branch 221 and a second sampling point voltage U2 of the second switching branch 222.

S603: The processing unit 202 controls the plurality of switching switches to be in a third working state, where the third working state is that the first switching switch S1 is turned on, and the second switching switch S2 to the fourth switching switch S4 are turned off.

S604: When the plurality of switching switches are in the third working state, the processing unit 202 detects a fifth sampling point voltage U5 of the first switching branch 221.

S605: The processing unit 202 determines the insulation resistance value $R_p$ to ground of the positive electrode of the battery pack and the insulation resistance value $R_n$ to ground of the negative electrode of the battery pack based on the first sampling point voltage U1, the second sampling point voltage U2, and the fifth sampling point voltage U5.

Specifically, the processing unit 202 may calculate the insulation resistance value $R_p$ to ground of the positive electrode of the battery pack and the insulation resistance value $R_n$ to ground of the negative electrode of the battery pack based on a voltage division law and a Kirchhoff's current law. Formulas are as follows:

$$U_{p1}/(R_p//(R1+R_{11}+R_{12}))=-U_{n1}/(R_n//(R2+R_{21}+R_{22}));\quad(7)$$

$$U_{p2}/(R_p//(R1+R_{11}+R_{12}))=-U_{n2}/R_n;\quad(8)$$

$$U_{p1}=U1\times(R1+R_{11}+R_{12})/R_{12};\quad(9)$$

$$U_{n1}=U2\times(R2+R_{21}+R_{22})/R_{22};\quad(10)$$

$$U_{p2}=U5\times(R1+R_{11}+R_{12})/R_{12};\quad(11)$$

$$U_{n2}=U_{n1}-U_{p1}+U_{p2};\quad(12)$$

herein, $U_{p1}$ represents a positive electrode voltage of the battery pack in the first working state, $U_{n1}$ represents a negative electrode voltage of the battery pack in the first working state, $U_{p2}$ represents a positive electrode voltage of the battery pack in the third working state, $U_{n2}$ represents a negative electrode voltage of the battery pack in the third working state, R1 represents the resistance value of the first switching resistor R1, R2 represents the resistance value of the second switching resistor R2, $R_{11}$ represents the resistance value of the upsampling resistor $R_{11}$ of the first sampling branch 2011, $R_{12}$ represents the resistance value of the downsampling resistor $R_{12}$ of the first sampling branch 2011, $R_{21}$ represents the resistance value of the upsampling resistor $R_{21}$ of the second sampling branch 2012, and $R_{22}$ represents the resistance value of the downsampling resistor $R_{22}$ of the second sampling branch 2012.

The formula (7) and the formula (8) use a Kirchhoffs current principle, that is, a value of a current flowing from the positive electrode of the battery pack to the ground is equal to a value of a current flowing from the ground to the negative electrode of the battery pack. The formulas (9) to (11) use a resistance voltage division principle. The formula (12) uses a principle that the battery pack voltage remains unchanged.

Optionally, in S603 to S605, the processing unit 202 may alternatively control the plurality of switching switches to be in a fourth working state, where the fourth working state includes that the second switching switch S2 is turned on, and the first switching switch S1, the third switching switch S3, and the fourth switching switch S4 are turned off. When the plurality of switching switches are in the fourth working state, the processing unit 202 may detect a sixth sampling point voltage U6 of the second switching branch 222, and determine the insulation resistance value $R_p$ to ground of the positive electrode of the battery pack and the insulation resistance value $R_n$ to ground of the negative electrode of the battery pack based on the first sampling point voltage U1, the second sampling point voltage U2, and the sixth sampling point voltage U6.

Correspondingly, the processing unit 202 may calculate $R_p$ and $R_n$ based on the following formulas:

$$U_{p1}/(R_p//(R1+R_{11}+R_{12}))=-U_{n1}/(R_n//(R2+R_{21}+R_{22}));\quad(13)$$

$$U_{p3}/R_p=-U_{n3}/(R_n//R2+R_{21}+R_{22});\quad(14)$$

$$U_{p1}=U1\times(R1+R_{11}+R_{12})/R_{12};\quad(15)$$

$$U_{n1}=U2\times(R2+R_{21}+R_{22})/R_{22};\quad(16)$$

$$U_{n3}=U6\times(R2+R_{21}+R_{22})/R_{22};\quad(17)$$

$$U_{p3}=U_{p1}-U_{n1}+U_{n3};\quad(18)$$

herein, $U_{p1}$ represents a positive electrode voltage of the battery pack in the first working state, $U_{n1}$ represents a negative electrode voltage of the battery pack in the first working state, $U_{p3}$ represents a positive electrode voltage of the battery pack in the fourth working state, $U_{n3}$ represents a negative electrode voltage of the battery pack in the fourth working state, R1 represents the resistance value of the first switching resistor R1, R2 represents the resistance value of the second switching resistor R2, $R_{11}$ represents the resistance value of the upsampling resistor $R_{11}$ of the first sampling branch 2011, $R_{12}$ represents the resistance value of the downsampling resistor $R_{12}$ of the first sampling branch 2011, $R_{21}$ represents the resistance value of the upsampling resistor $R_{21}$ of the second sampling branch 2012, and $R_{22}$ represents the resistance value of the downsampling resistor $R_{22}$ of the second sampling branch 2012.

It should be understood that the solution in FIG. 6 is merely used as an example for description of insulation detection. With reference to the detection apparatus 200 provided in this disclosure, a control unit may control the plurality of switching switches to be in another working state, and obtain a corresponding sampling point voltage, to calculate the insulation resistance value $R_p$ to ground of the positive electrode of the battery pack and the insulation resistance value $R_n$ to ground of the negative electrode of the battery pack.

Figure 7:
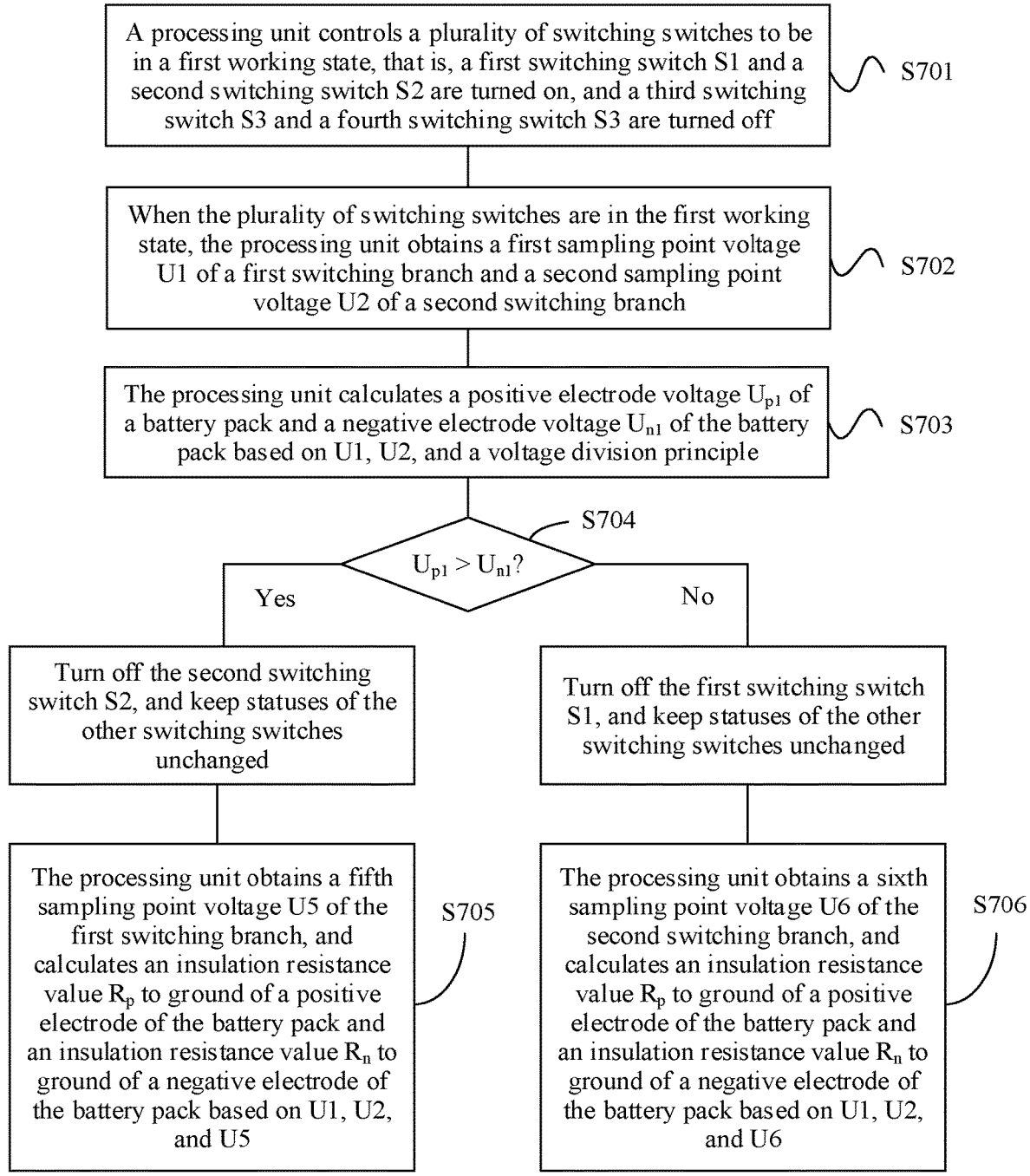
FIG. 7 is a flowchart of an insulation detection method for a battery system according to another embodiment.

With reference to FIG. 7, the following continues to describe a specific example of the insulation detection method.

FIG. 7 is a flowchart of an insulation detection method for a battery system according to another embodiment. As shown in FIG. 7, the method includes the following steps.

S701: The processing unit 202 controls the plurality of switching switches to be in a first working state, that is, the first switching switch S1 and the second switching switch S2 are turned on, and the third switching switch S3 and the fourth switching switch S4 are turned off.

S702: When the plurality of switching switches are in the first working state, the processing unit 202 obtains a first sampling point voltage U1 of the first switching branch 221 and a second sampling point voltage U2 of the second switching branch 222.

S703: The processing unit 202 calculates a positive electrode voltage $U_{p1}$ of the battery pack and a negative electrode voltage $U_{n1}$ of the battery pack based on U1, U2, and a voltage division principle.

For calculation manners of the positive electrode voltage $U_{p1}$ of the battery pack and the negative electrode voltage $U_{n1}$ of the battery pack, refer to related descriptions of FIG. 6. Details are not described herein.

S704: The processing unit 202 determines values of $U_{p1}$ and $U_{n1}$, and if $U_{p1} > U_{n1}$, turns off the second switching switch S2, keeps statuses of the other switching switches unchanged, and performs S705; or if $U_{p1} < U_{n1}$, turns off the first switching switch S1, keeps statuses of the other switching switches unchanged, and performs S706.

In S704, when the voltage $U_{p1}$ is greater than $U_{n1}$, it indicates that the insulation resistance $R_p$ to ground of the positive electrode of the battery pack is greater than the insulation resistance $R_n$ to ground of the negative electrode of the battery pack. If the second switching switch S2 is turned off, $R_p$ and $R_n$ are calculated by using the formulas (7) to (12). In the formula (8), an order of magnitude of a resistance value obtained after $R_p$ and $(R1+R_{11}+R_{12})$ are connected in parallel is closer to an order of magnitude of a resistance value of $R_n$, so that an error in subsequent calculation can be reduced. In this case, if the first switching switch S1 is selected to be turned off, $R_p$ and $R_n$ need to be calculated by using the formulas (13) to (18). In the formula (14), there is a greater difference between an order of magnitude of a resistance value of $R_p$ and an order of magnitude of a resistance value obtained after $R_n$ and $(R2+R_{21}+R_{22})$ are connected in parallel, and this causes an increase in a calculation error.

Similarly, when the voltage $U_{p1}$ is less than $U_{n1}$, the first switching switch S1 is selected to be turned off, and $R_p$ and $R_n$ are calculated by using the formulas (13) to (18), so that a calculation error is smaller.

Therefore, the manner in S704 is used to calculate $R_p$ and $R_n$, so that accuracy of calculating $R_p$ and $R_n$ can be improved.

S705: If the second switching switch S2 is turned off in S704, the processing unit 202 obtains a fifth sampling point voltage U5 of the first switching branch 221, and calculates the insulation resistance value $R_p$ to ground of the positive electrode of the battery pack and the insulation resistance value $R_n$ to ground of the negative electrode of the battery pack based on U1, U2, and U5.

Specifically, $R_p$ and $R_n$ may be calculated based on the formulas (7) to (12). Details are not described herein.

S706: If the first switching switch S1 is turned off in S704, the processing unit 202 obtains a sixth sampling point voltage U6 of the second switching branch 222, and calculates the insulation resistance value $R_p$ to ground of the positive electrode of the battery pack and the insulation resistance value $R_n$ to ground of the negative electrode of the battery pack based on U1, U2, and U6.

Specifically, $R_p$ and $R_n$ may be calculated based on the formulas (13) to (18). Details are not described herein.

Figure 8:
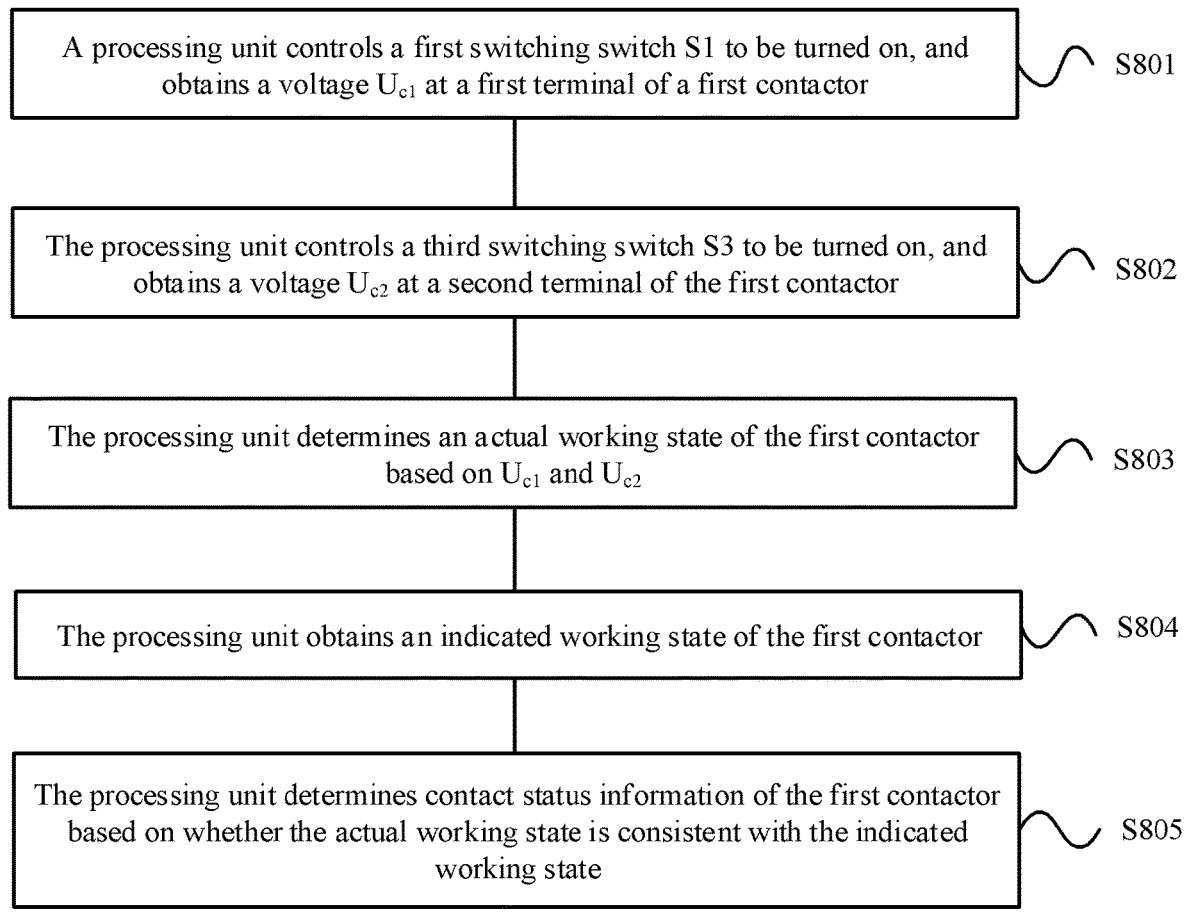
FIG. 8 is a flowchart of an adhesion detection method for a contactor according to an embodiment.
Figure 9:
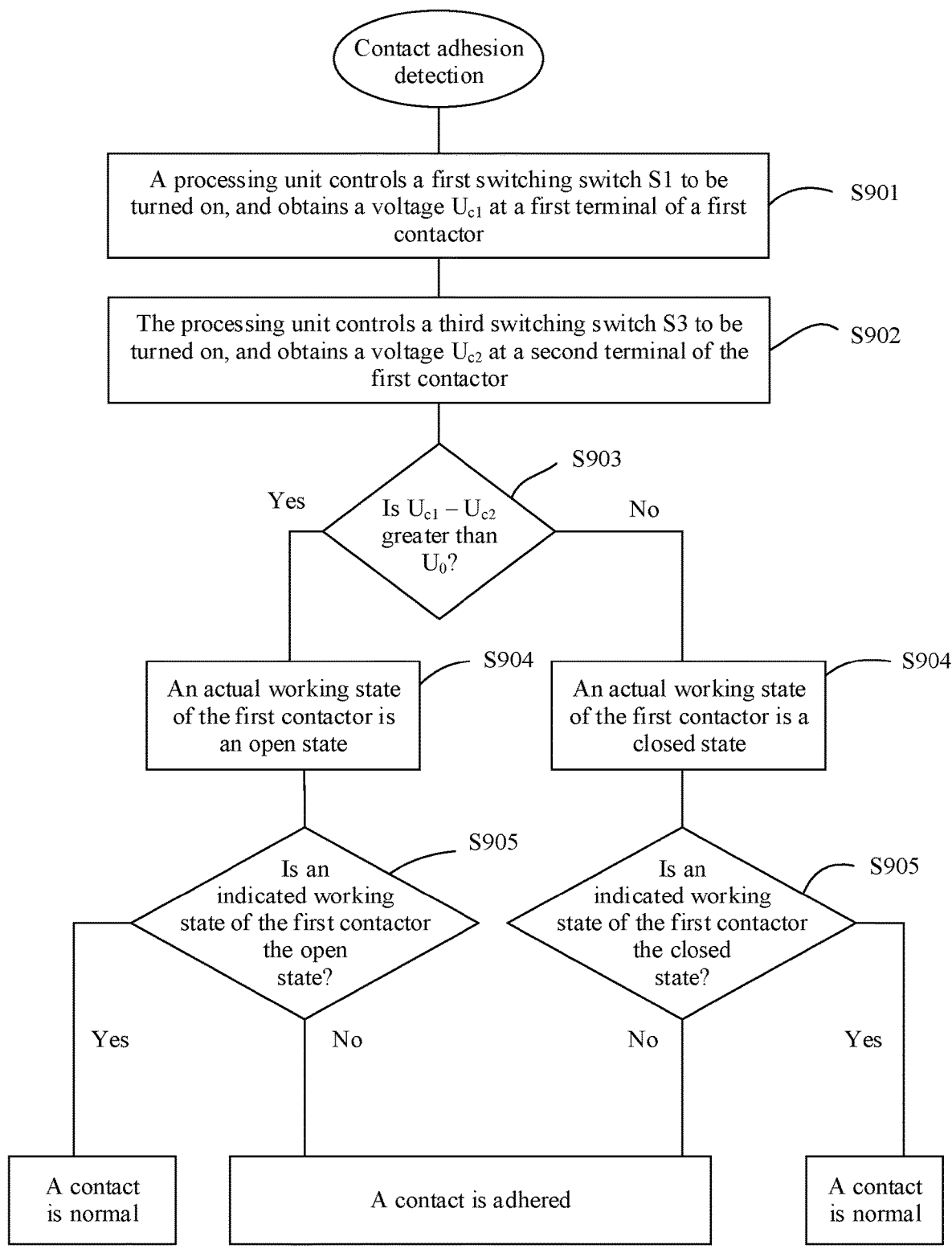
FIG. 9 is a flowchart of an adhesion detection method for a contactor according to an embodiment.

With reference to FIG. 8 and FIG. 9, the following describes the adhesion detection method for a contactor in embodiments.

FIG. 8 is a flowchart of an adhesion detection method for a contactor according to an embodiment. In FIG. 8, an example in which the first contactor 101 is detected is used for description. As shown in FIG. 8, the method includes the following steps.

S801: The processing unit 202 controls the first switching switch S1 to be turned on, and obtains a voltage $U_{c1}$ at the first terminal of the first contactor 101.

S802: The processing unit 202 controls the third switching switch S3 to be turned on, and obtains a voltage $U_{c2}$ at the second terminal of the first contactor 101.

Specifically, the processing unit 202 may separately obtain sampling point voltages of the first switching branch 221 and the second switching branch 222, and calculate $U_{c1}$ and $U_{c2}$ by using a voltage division principle.

S803: The processing unit 202 determines an actual working state of the first contactor 101 based on $U_{c1}$ and $U_{c2}$.

For example, the processing unit 202 may determine the actual working state of the first contactor 101 based on whether $U_{c1} - U_{c2}$ is greater than a preset threshold $U_0$. If $U_{c1} - U_{c2} \geq U_0$, it is determined that the actual working state of the first contactor 101 is an open state; or if $U_{c1} - U_{c2} < U_0$, it is determined that the first contactor 101 is in a closed state. A value of the preset threshold $U_0$ may be determined based on practice.

S804: The processing unit 202 obtains an indicated working state of the first contactor 101, where the indicated working state is a working state that is of the first contactor 101 and that is indicated by a contactor control signal.

S805: The processing unit 202 determines the contact status information of the first contactor 101 based on whether the actual working state is consistent with the indicated working state.

For example, the processing unit 202 determines whether the actual working state of the first contactor 101 is consistent with the indicated working state. If the actual working state is consistent with the indicated working state, it is determined that the contact status information is that contact adhesion does not occur on the first contactor 101; or if the actual working state is inconsistent with the indicated working state, it is determined that the contact status information is that contact adhesion occurs on the first contactor 101.

FIG. 9 is a flowchart of an adhesion detection method for a contactor according to an embodiment. In FIG. 9, an example in which the first contactor 101 is detected is used for description. As shown in FIG. 9, the method includes the following steps.

S901: The processing unit 202 controls the first switching switch S1 to be turned on, and obtains a voltage $U_{c1}$ at the first terminal of the first contactor 101.

S902: The processing unit 202 controls the third switching switch S3 to be turned on, and obtains a voltage $U_{c2}$ at the second terminal of the first contactor 101.

S903: The processing unit 202 determines an actual working state of the first contactor 101 based on whether $U_{c1} - U_{c2}$ is greater than a preset threshold $U_0$.

S904: If $U_{c1} - U_{c2} \geq U_0$, it is determined that the actual working state of the first contactor 101 is an open state; or if $U_{c1} - U_{c2} < U_0$, it is determined that the first contactor 101 is in a closed state.

S905: The processing unit 202 determines whether the actual working state of the first contactor 101 is consistent with a working state indicated by a contactor control signal. If the actual working state is consistent with the indicated working state, it is determined that contact adhesion does not occur on the first contactor 101, and a contact is normal; or if the actual working state is inconsistent with the indicated working state, it is determined that contact adhesion occurs on the first contactor 101.

Figure 10:
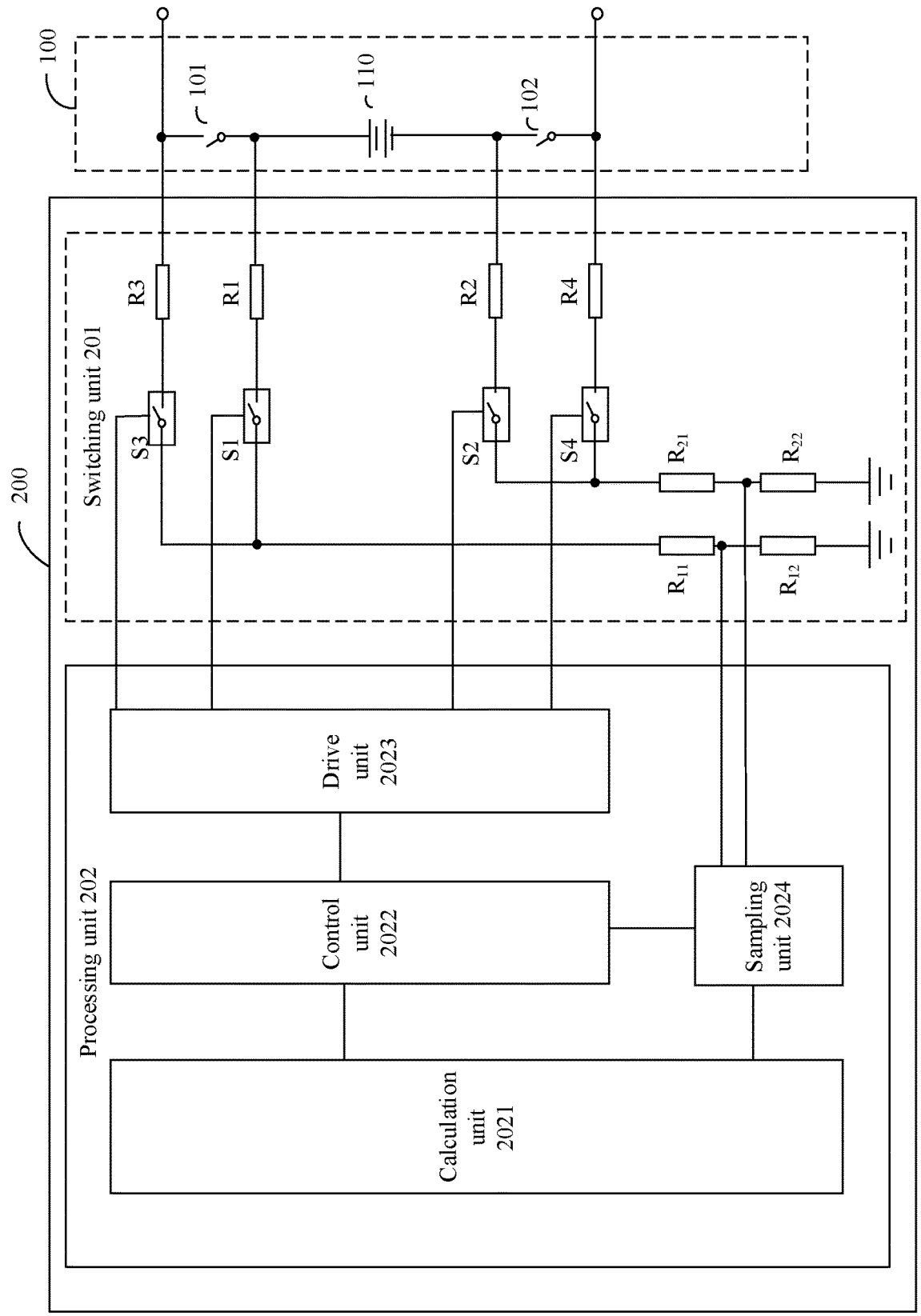
FIG. 10 is a schematic diagram of a detection apparatus according to another embodiment.

FIG. 10 is a schematic diagram of a detection apparatus 200 according to another embodiment. As shown in FIG. 10, in an example, the processing unit 202 may further include a plurality of subunits, to implement the foregoing steps performed by the processing unit 202. As shown in FIG. 10, the processing unit 202 may include a calculation unit 2021, a control unit 2022, a drive unit 2023, and a sampling unit 2024. Functions of the units are described below.

The sampling unit 2024 is configured to collect sampling point voltage information of a switching branch in the switching unit 201, and transmit the obtained sampling point voltage information to the calculation unit.

The calculation unit 2021 is configured to perform calculation and logic processing based on the sampling point voltage information collected by the sampling unit 2024. The calculation unit is further configured to obtain information indicating a contactor control signal or a switching control signal from the control unit 2022, and perform calculation and logic processing.

The control unit 2022 is configured to send a contactor control signal or a switching control signal to the drive unit 2023. The contactor control signal is used to control turn-on and turn-off of a contactor, and the switching control signal is used to control turn-on and turn-off of a switch in the switching unit.

The drive unit 2023 is configured to receive the contactor control signal or the switching control signal sent by the calculation unit 2021, and drive the contactor or the switching switch in the switching unit based on the contactor control signal or the switching control signal.

It should be understood that the subunits in FIG. 10 may be integrated into one independent module, or may be disposed in different modules.

Figure 11:
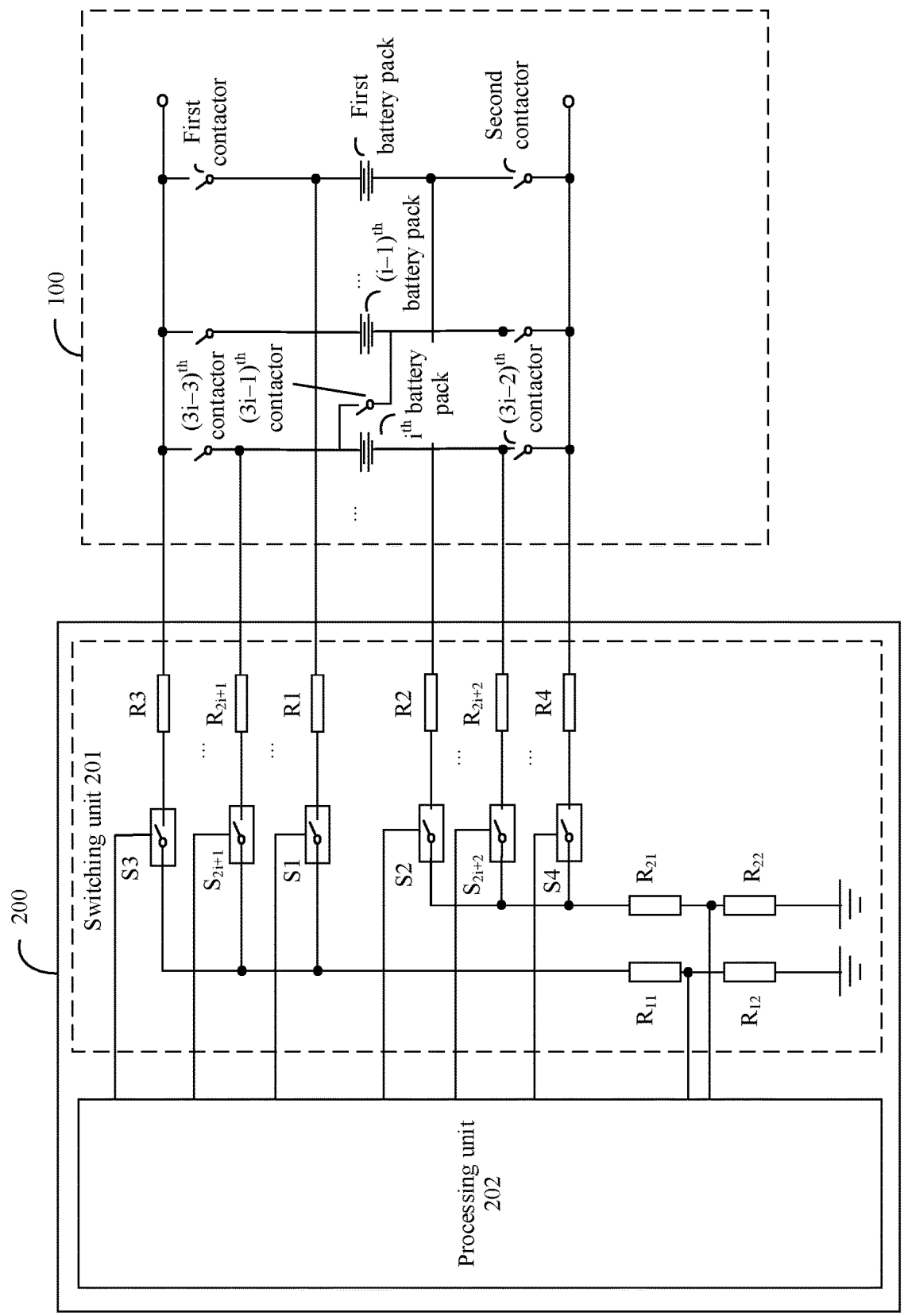
FIG. 11 is a schematic diagram of a detection apparatus according to an embodiment.

The foregoing describes the detection apparatus 200 by using an example in which the battery system includes a single battery pack. Optionally, the detection apparatus 200 in embodiments may also be applied to a battery system with a plurality of battery packs. With reference to FIG. 11, the following continues to describe a detection apparatus 200 that can be applied to a battery system with a plurality of battery packs.

FIG. 11 is a schematic diagram of a detection apparatus 200 according to an embodiment. As shown in FIG. 11, the battery system includes N battery packs, and a first contactor to a $(3N-1)^{th}$ contactor. The battery pack in FIG. 2 may be a first battery pack in the N battery packs. A positive electrode of an it battery pack in the N battery packs is connected to a first terminal of a $(3i-3)^{th}$ contactor, a second terminal of the $(3i-3)^{th}$ contactor is configured to connect to a first terminal of a load, a negative electrode of the $i^{th}$ battery pack is connected to a first terminal of a $(3i-2)^{th}$ contactor, a second terminal of the $(3i-2)^{th}$ contactor is connected to a second terminal of the load, and a $(3i-1)^{th}$ contactor is disposed between the positive electrode of the $i^{th}$ battery pack and a negative electrode of an $(i-1)^{th}$ battery pack, where N≥2, and 2≤i≤N.

Optionally, a serial connection, a parallel connection, or a combination of a serial connection and a parallel connection may be flexibly implemented between the N battery packs by controlling turn-on and turn-off of the 3N−1 contactors.

Still refer to FIG. 11. The plurality of switching switches further include a fifth switching switch to a $(2N+2)^{th}$ switching switch, and the plurality of switching branches further include a fifth switching branch to a $(2N+2)^{th}$ switching branch.

A $(2i+1)^{th}$ switching branch includes a $(2i+1)^{th}$ switching resistor $R_{2i+1}$, and a $(2i+1)^{th}$ switching switch $S_{2i+1}$ is configured to control the $(2i+1)^{th}$ switching branch to be switched in or out between the positive electrode of the $i^{th}$ battery pack and the reference ground.

A $(2i+2)^{th}$ switching branch includes a $(2i+2)^{th}$ switching resistor $R_{2i+2}$, and a $(2i+2)$th switching switch is configured to control the $(2i+2)^{th}$ switching branch to be switched in or out between the negative electrode of the $i^{th}$ battery pack and the reference ground.

Optionally, the first terminal of the first sampling branch 2011 is connected to a second terminal of the $(2i+1)^{th}$ switching branch, and the first terminal of the second sampling branch 2012 is connected to a second terminal of the $(2i+2)^{th}$ switching branch.

It should be understood that the battery system in FIG. 11 may flexibly implement various combinations of a plurality of battery packs connected in series, in parallel, or in series-parallel. With reference to the foregoing descriptions, the detection apparatus 200 in FIG. 11 may implement high-voltage detection, insulation detection, and contact adhesion detection of a contactor on a single battery pack or the foregoing combinations.

Optionally, the detection apparatus 200 in FIG. 11 may also be properly changed. For example, connection relationships or quantities of the plurality of switching branches and the plurality of sampling branches may be changed, provided that the detection apparatus 200 can implement a function of detecting voltages at different terminals in the battery system.

In this embodiment, the switching branches in the switching unit of the detection apparatus for the battery system may be extended based on a quantity and a connection manner of the battery packs in the to-be-detected battery system, to implement high-voltage detection and insulation detection of the battery system including a plurality of battery packs by using one set of circuits, so that a circuit design can be optimized, and circuit detection efficiency can be improved.

Terms such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, an execution thread, a program, and/or a computer. As illustrated by using figures, both a computing device and an application that runs on the computing device may be components. One or more components may reside within a process and/or an execution thread, and a component may be located on one computer and/or distributed between two or more computers. In addition, these components may be executed from various computer-readable media that store various data structures. The components may communicate by using a local and/or remote process and based on, for example, a signal having one or more data packets (for example, data from two components interacting with another component in a local system, a distributed system, and/or across a network such as the Internet interacting with other systems by using the signal).

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this disclosure.

It may be clearly understood by a person skilled in the art that, for the purpose of convenient and brief description, for a detailed working process of the foregoing system, apparatus, and unit, refer to a corresponding process in the foregoing method embodiments. Details are not described herein.

In the several embodiments provided, it should be understood that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments may be integrated into one processing unit, each of the units may exist alone physically, or two or more units may be integrated into one unit.

When the functions are implemented in the form of a software functional unit and sold or used as an independent product, the functions may be stored in a computer-readable storage medium. Based on such an understanding, the technical solutions may be implemented in a form of a software product. The computer software product is stored in a storage medium, and includes several instructions for instructing a computer device (which may be a personal computer, a server, a network device, or the like) to perform all or some of the steps of the methods described in embodiments. The foregoing storage medium includes any medium that can store program code, such as a USB flash drive, a removable hard disk, a read-only memory (ROM), a random-access memory (RAM), a magnetic disk, or an optical disc.

The foregoing descriptions are merely specific implementations, but are not intended to limit the protection scope of this disclosure. Any variation or replacement readily figured out by a person skilled in the art within the technical scope disclosed shall fall within the protection scope of this disclosure. Therefore, the protection scope of this disclosure shall be subject to the protection scope of the claims.

What is claimed is:

1. A detection apparatus comprising:
a switching system comprising:
a reference ground configured to connect to a vehicle body ground; and
switching branches comprising switching resistors configured to control the switching branches to be switched in or out between the reference ground and a positive electrode of a battery pack, the reference ground and a first terminal of a first contactor of a battery system, the reference ground and a negative electrode of the battery pack of the battery system, and the reference ground and a second terminal of a second contactor of the battery system; and
a processor configured to:
detect sampling point voltage information of the switching branches, wherein the sampling point voltage information indicates sampling point voltages of the switching branches;
determine high-voltage detection information comprising a battery pack voltage $U_{bat}$ of the battery pack or a load voltage $U_{load}$ of a load of the battery pack;
determine insulation detection information comprising an insulation resistance value $R_p$ of the positive electrode or an insulation resistance value $R_n$ of the negative electrode; and
determine, based on the sampling point voltage information, first contact status information of the first contactor or second contact status information of the second contactor.

2. The detection apparatus of claim 1, wherein the first contact status information indicates whether the first contactor is adhered to, and wherein the second contact status information indicates whether the second contactor is adhered to.

3. The detection apparatus of claim 1, wherein the switching system further comprises sampling branches, wherein the sampling branches comprise third terminals and fourth terminals, wherein each of the third terminals is connected to at least one of the fourth terminals, and wherein the fourth terminals are connected to the reference ground.

4. The detection apparatus of claim 3, wherein the sampling branches further comprise upsampling resistors and downsampling resistors, wherein fifth terminals of the upsampling resistors are connected to the third terminals, wherein sixth terminals of the upsampling resistors are connected to seventh terminals of the downsampling resistors, wherein eighth terminals of the downsampling resistors are connected to the reference ground, and wherein the sampling point voltages are voltages at the sixth terminals.

5. The detection apparatus of claim 4, further comprising switching switches, wherein the switching branches comprise a first switching branch, a second switching branch, a third switching branch, and a fourth switching branch, and wherein the switching switches comprise:
a first switching switch configured to control the first switching branch to be switched in or out between the positive electrode and the reference ground;
a second switching switch configured to control the second switching branch to be switched in or out between the negative electrode and the reference ground;
a third switching switch configured to control the third switching branch to be switched in or out between the first terminal and the reference ground; and
a fourth switching switch configured to control the fourth switching branch to be switched in or out between the second terminal and the reference ground.

6. The detection apparatus of claim 5, wherein the first switching branch comprises a third terminal, wherein the second switching branch comprises a fourth terminal, wherein the third switching branch comprises a fifth terminal, wherein the fourth switching branch comprises a sixth terminal, and wherein the sampling branches comprise:

a first sampling branch comprising a seventh terminal connected to the third terminal and the fifth terminal; and a second sampling branch comprising an eighth terminal connected to the sixth terminal.

7. The detection apparatus of claim 6, wherein the processor is further configured to:
control the switching switches to be in a working state in which the first switching switch and the second switching switch are turned on and the third switching switch and the fourth switching switch are turned off;
detect, when the switching switches are in the working state, a first sampling point voltage U1 of the first switching branch and a second sampling point voltage U2 of the second switching branch; and
determine the battery pack voltage $U_{bat}$ based on U1 and U2.

8. The detection apparatus of claim 7, wherein the first sampling branch further comprises a first switching resistor, a first upsampling resistor, and a first downsampling resistor, wherein the second sampling branch further comprises a second switching resistor, a second upsampling resistor and a second downsampling resistor, and wherein the processor is further configured to determine $U_{bat}$ based on the following formulas:

$$U_{bat}=U_p-U_n$$

$$U_p=U1\times(R1+R_{11}+R_{12})/R_{12}$$

$$U_n=U2\times(R2+R_{21}+R_{22})/R_{22},$$

wherein $U_p$ is a positive electrode voltage of the battery pack, $U_n$ is a negative electrode voltage of the battery pack, R1 is a first resistance of the first switching resistor, R2 is a second resistance of the second switching resistor, $R_{11}$ is a third resistance of the first upsampling resistor, $R_{12}$ is a fourth resistance of the first downsampling resistor, $R_{21}$ is a fifth resistance of the second upsampling resistor, and $R_{22}$ is a sixth resistance of the second downsampling resistor.

9. The detection apparatus of claim 6, wherein the processor is further configured to:
control the switching switches, the first contactor, and the second contactor to be in a working state in which the first switching switch, the second switching switch, the first contactor, and the second contactor are turned off and the third switching switch and the fourth switching switch are turned on;
detect, when the switching switches, the first contactor, and the second contactor are in the working state, a third sampling point voltage U3 of the third switching branch and a fourth sampling point voltage U4 of the fourth switching branch; and
determine $U_{load}$ based on U3 and U4.

10. The detection apparatus of claim 9, wherein the first sampling branch further comprises a first upsampling resistor and a first downsampling resistor, wherein the second sampling branch further comprises a second upsampling resistor and a second downsampling resistor, wherein the third switching branch comprises a third switching resistor, wherein the fourth switching branch comprises a fourth switching resistor, and wherein the processor is further configured to determine $U_{load}$ based on the following formulas:

$$U_{load}=U_p'-U_n'$$

$$U_p'=U3\times(R3+R_{11}+R_{12})/R_{12}$$

$$U_n'=U4\times(R4+R_{21}+R_{22})/R_{12},$$

wherein $U_p'$ is a first voltage at a ninth terminal of the load, $U_n'$ is a second voltage at a tenth terminal of the load, R3 is a first resistance of the third switching resistor, R4 is a second resistance of the fourth switching resistor, $R_{11}$ is a third resistance of the first upsampling resistor, $R_{12}$ is a fourth resistance of the first downsampling resistor, $R_{21}$ is a fifth resistance of the second upsampling resistor, and $R_{22}$ is a sixth resistance value of the second downsampling resistor.

11. The detection apparatus of claim 6, wherein the processor is further configured to:
control the switching switches to be in a first working state in which the first switching switch and the second switching switch are turned on and the third switching switch and the fourth switching switch are turned off;
detect, when the switching switches are in the first working state, a first sampling point voltage U1 of the first switching branch and a second sampling point voltage U2 of the second switching branch;
control the switching switches to be in a second working state in which the first switching switch is turned on and the second switching switch, the third switching switch, and the fourth switching switch are turned off;
detect, when the switching switches are in the second working state, a fifth sampling point voltage U5 of the first switching branch; and
determine $R_p$ and $R_n$ based on U1, U2, and U5.

12. The detection apparatus of claim 11, wherein the first sampling branch further comprises a first switching resistor, a first upsampling resistor, and a first downsampling resistor, wherein the second sampling branch further comprises a second switching resistor, a second upsampling resistor, and a second downsampling resistor, and wherein the processor is further configured to determine $R_p$ and $R_n$ based on the following formulas:

$$U_{p1}/(R_p//(R1+R1+R_{12}))=-U_{n1}/(R_n//(R2+R_{21}+R_{22}))$$

$$U_{p2}/(R_p//(R1+R_{11}+R_{12}))=-U_{n2}/R_n$$

$$U_{p1}=U1\times(R1+R_{11}+R_{12})/R_{12}$$

$$U_{n1}=U2\times(R2+R_{21}+R_{22})/R_{22}$$

$$U_{p2}=U5\times(R1+R_{11}+R_{12})/R_{12}$$

$$U_{n2}=U_{n1}-U_{p1}+U_{p2},$$

wherein $U_{p1}$ is a first positive electrode voltage of the battery pack in the first working state, $U_{n1}$ is a first negative electrode voltage of the battery pack in the first working state, $U_{p2}$ is a third positive electrode voltage of the battery pack in the second working state, $U_{n2}$ is a third negative electrode voltage of the battery pack in the second working state, R1 is a first resistance of the first switching resistor, R2 is a second resistance of the second switching resistor, $R_{11}$ is a third resistance of the first upsampling resistor, $R_{12}$ is a fourth resistance of the first downsampling resistor, $R_{21}$ is a fifth resistance of the second upsampling resistor, and $R_{22}$ is a sixth resistance of the second downsampling resistor.

13. The detection apparatus of claim 5, wherein the processor is further configured to:
control the first switching switch to be turned on;
obtain a voltage $U_{c1}$ at the first terminal;
control the third switching switch to be turned on;
obtain a voltage $U_{c2}$ at the second terminal;
determine an actual working state of the first contactor based on $U_{c1}$ and $U_{c2}$;

obtain an indicated working state of the first contactor, wherein the indicated working state is of the first contactor and is indicated by a contactor control signal; and obtain the first contact status information based on whether the actual working state is consistent with the indicated working state.

14. The detection apparatus of claim 5, wherein the switching switches further comprise a fifth switching switch to a $(2N+2)^{th}$ switching switch, wherein the switching branches further comprise a fifth switching branch to a $(2N+2)^{th}$ switching branch, wherein a $(2i+1)^{th}$ switching branch comprises a $(2i+1)^{th}$ switching resistor, wherein a $(2i+1)^{th}$ switching switch is configured to control the $(2i+1)^{th}$ switching branch to be switched in or out between an $i^{th}$ positive electrode of an $i^{th}$ battery pack of the battery system and the reference ground, wherein a $(2i+2)^{th}$ switching branch comprises a $(2i+2)^{th}$ switching resistor, and wherein a $(2i+2)^{th}$ switching switch is configured to control the $(2i+2)^{th}$ switching branch to be switched in or out between the negative electrode of the $i^{th}$ battery pack and the reference ground.

15. The detection apparatus of claim 14, wherein the $(2i+1)^{th}$ switching branch comprises a third terminal, wherein the $(2i+2)^{th}$ switching branch comprises a fourth terminal, and wherein the switching system further comprises:
a first sampling branch comprising a fifth terminal connected to the third terminal; and
a second sampling branch comprising a sixth terminal connected to the fourth terminal.

16. A method implemented by a detection apparatus and comprising:
detecting, by a processor of the detection apparatus, sampling point voltage information of switching branches of a switching system of the detection apparatus, wherein the sampling point voltage information indicates sampling point voltages of the switching branches;
determining, by the processor, high-voltage detection information comprising a battery pack voltage $U_{bat}$ of a battery pack of a battery system and a load voltage $U_{load}$ of a load of the battery pack;
determining, by the processor, insulation detection information comprising an insulation resistance value $R_p$ of a positive electrode of the battery pack and an insulation resistance value $R_n$ of a negative electrode of the battery pack; and
determining, by the processor and based on the sampling point voltage information, first contact status information of a first contactor of the battery system or second contact status information of a second contactor of the battery system.

17. The method of claim 16, wherein the first contact status information indicates whether the first contactor is adhered to, and wherein the second contact status information indicates whether the second contactor is adhered to.

18. The method of claim 16, further comprising:
controlling, by a first switching switch of switching switches of the detection apparatus, a first switching branch of the switching branches to be switched in or out between the positive electrode and a reference ground of the switching system;
controlling, by a second switching switch of the switching switches, a second switching branch of the switching branches to be switched in or out between the negative electrode and the reference ground;
controlling, by a third switching switch of the switching switches, a third switching branch of the switching branches to be switched in or out between a first terminal of the first contactor and the reference ground; and
controlling, by a fourth switching switch of the switching switches, a fourth switching branch of the switching branches to be switched in or out between a second terminal of the second contactor and the reference ground.

19. The method of claim 18, further comprising:
controlling, by the processor, the switching switches to be in a working state in which the first switching switch and the second switching switch are turned on and the third switching switch and the fourth switching switch are turned off;
detecting, by the processor and when the switching switches are in the working state, a first sampling point voltage U1 of the first switching branch and a second sampling point voltage U2 of the second switching branch; and
determining, by the processor, the battery pack voltage $U_{bat}$ based on U1 and U2.

20. The method of claim 18, further comprising:
controlling, by the processor, the switching switches, the first contactor, and the second contactor to be in a working state in which the first switching switch, the second switching switch, the first contactor, and the second contactor are turned off and the third switching switch and the fourth switching switch are turned on;
detecting, by the processor and when the switching switches, the first contactor, and the second contactor are in the working state, a third sampling point voltage U3 of the third switching branch and a fourth sampling point voltage U4 of the fourth switching branch; and
determining, by the processor, $U_{load}$ based on U3 and U4.

* * * * *

UNITED STATES PATENT AND TRADEMARK OFFICE
CERTIFICATE OF CORRECTION

Page 1 of 1

PATENT NO. : 12,422,487 B2
APPLICATION NO. : 18/456331
DATED : September 23, 2025
INVENTOR(S) : Wencheng Wang It is certified that error appears in the above-identified patent and that said Letters Patent is hereby corrected as shown below:

In the Claims

Claim 11, Column 28, Line 36: "$(R1+R1+R_{12})$" should read "$(R1+R_{11}+R_{12})$"

Signed and Sealed this
Twenty-eighth Day of October, 2025

John A. Squires
*Director of the United States Patent and Trademark Office*